(12) United States Patent
Mikulecky

(10) Patent No.: US 7,636,096 B2
(45) Date of Patent: Dec. 22, 2009

(54) AUTOMATICALLY BALLOONING AN ASSEMBLY DRAWING OF A COMPUTER AIDED DESIGN

(75) Inventor: Martin Mikulecky, Desin (CZ)

(73) Assignee: Autodesk, Inc., San Rafael, CA (US)

( * ) Notice: Subject to any disclaimer, the term of this patent is extended or adjusted under 35 U.S.C. 154(b) by 899 days.

(21) Appl. No.: 10/877,643

(22) Filed: Jun. 25, 2004

(65) Prior Publication Data
US 2005/0288909 A1    Dec. 29, 2005

(51) Int. Cl.
*G09G 5/00* (2006.01)
*G06T 11/20* (2006.01)

(52) U.S. Cl. .................. 345/619; 345/441; 345/443; 345/650

(58) Field of Classification Search .......... 345/619, 345/441, 443, 650; 715/700–715
See application file for complete search history.

(56) References Cited

U.S. PATENT DOCUMENTS

| | | | |
|---|---|---|---|
| 4,663,616 A | 5/1987 | Christensen | |
| 4,843,569 A | 6/1989 | Sawada et al. | |
| 4,951,227 A * | 8/1990 | Todd | 345/660 |
| 5,237,647 A | 8/1993 | Roberts et al. | |
| 5,386,504 A | 1/1995 | Yoda | |
| 5,526,478 A | 6/1996 | Russell, Jr. et al. | |
| 5,559,707 A | 9/1996 | Delorme et al. | |
| 5,617,524 A | 4/1997 | Dao et al. | |
| 5,625,827 A | 4/1997 | Krause et al. | |
| 5,630,041 A | 5/1997 | Mills et al. | |
| 5,724,072 A | 3/1998 | Freeman et al. | |
| 5,745,761 A | 4/1998 | Celi, Jr. et al. | |
| 5,774,720 A | 6/1998 | Borgeendale et al. | |
| 5,831,633 A | 11/1998 | Van Roy | |
| 5,835,693 A | 11/1998 | Lynch et al. | |
| 5,845,288 A | 12/1998 | Syeda-Mahmood | |
| 5,862,379 A | 1/1999 | Rubin et al. | |
| 6,047,233 A | 4/2000 | Salvatore et al. | |
| 6,184,860 B1 | 2/2001 | Yamakawa | |
| 6,243,102 B1 | 6/2001 | Ruff et al. | |
| 6,289,396 B1 | 9/2001 | Keller et al. | |
| 6,356,284 B1 | 3/2002 | Manduley et al. | |
| 6,366,293 B1 | 4/2002 | Hamilton et al. | |

(Continued)

FOREIGN PATENT DOCUMENTS

JP     60015777 A     1/1985

OTHER PUBLICATIONS

Vivier et al., "Annotation: an A1 Approach to Engineering Drawing Annotation" ACM SIGART, Mar. 1988, pp. 447-455.

(Continued)

*Primary Examiner*—Xiao M Wu
*Assistant Examiner*—David T Welch
(74) *Attorney, Agent, or Firm*—Fish & Richardson P.C.

(57) ABSTRACT

Methods and apparatus, including computer program products, are described for ballooning an assembly drawing of a computer aided design. In one implementation, a set of anchor points is received and a set of balloons is arranged along a polygon enclosing a region including the set of anchor points. The set of balloons is iterated through, and the balloons in the set of balloons are attached to anchor points in the set of anchor points by leaders. Upon completion of one iteration no two leaders intersect.

14 Claims, 37 Drawing Sheets

U.S. PATENT DOCUMENTS

| | | |
|---|---|---|
| 6,496,195 B1 | 12/2002 | Gill et al. |
| 6,594,696 B1 | 7/2003 | Walker et al. |
| 6,611,725 B1 | 8/2003 | Harrison et al. |
| 6,768,928 B1 | 7/2004 | Nagasawa et al. |
| 6,778,275 B2 * | 8/2004 | Bowes .................. 356/400 |
| 6,810,401 B1 | 10/2004 | Thompson et al. |
| 6,950,113 B2 * | 9/2005 | Gill et al. ............... 345/619 |
| 7,117,199 B2 * | 10/2006 | Frank et al. ............... 707/3 |
| 2003/0165264 A1 | 9/2003 | Tanabe et al. |

OTHER PUBLICATIONS

Hutton et al., "A Strategy for On-Line Interpretation of Sketched Engineering Drawings", IEEE, 1997, pp. 771-775.

Krause et al., "Processing of CAD-Data—Conversion, Verification and Repair", *Solid Modeling*, 1997, pp. 248-254.

Nousch et al., "CAD on the World Wide Web: Virtual Assembly of Furniture with BEAVER", SIGGRAPH, ACM Feb. 1999, pp. 113-119.

http://www/ugsolutions.com/products/unigraphics/cad/drafting, printed May 1, 2000, 2 pgs.

Bidarra et al. "A Collaborative Framework for Integrated Part and Assembly Modeling", Proceedings of the Fourth Symposium on Virtual Reality Modeling Language, ACM, Jun. 2002, pp. 389-400.

Finkelstein, "AutoCAD 2002 Bible, Part II" 2002, pp. 400-406.

Banach et al., "Autodesk Inventor 6 *Essentials*", 2003, pp. 271-284.

* cited by examiner

AUTOMATICALLY BALLOONING AN ASSEMBLY DRAWING OF A COMPUTER AIDED DESIGN

TECHNICAL FIELD

The present invention relates to computer aided design.

BACKGROUND

A computer aided design (CAD) application can be used by a designer to create an assembly drawing that may include a number of components. The designer can identify the components of the assembly drawing by attaching each component to an identifier, such as a circular outline including a label, e.g., a letter or number. Such identifiers are sometimes referred to as "balloons". An assembly drawing can include, for example, a nut and bolt assembly. The designer can identify the components of the assembly drawing by attaching a balloon to a component in the assembly drawing that represents the head of the nut, attaching a second balloon to a component that represents the thread of the nut, and attaching a third balloon to component that represents the bolt. The balloons can be attached to the components by lines, sometimes referred to as "leaders" or "leaders lines". The process of identifying components of an assembly drawing by attaching the components to balloons by leaders can be referred to as "ballooning".

The ballooning process can be labor intensive, requiring the creation and placement of balloons, connecting the balloons by leaders to components in the assembly drawing, and further manipulating positions of the balloons in order to achieve a substantially legible and decipherable assembly drawing. The latter step can involve tedious manipulating of the positions of the balloons, and/or changing which components the balloons are attached to (i.e., the balloon-component pairings), such that leaders do not intersect. As the number of components of an assembly drawing increases, the time and effort required for ballooning also increases, and manipulating the positions of balloons to achieve a substantially legible and decipherable assembly drawing can become more difficult.

Some conventional CAD applications create and place balloons automatically for the designer, and attach balloons to components of an assembly drawing. Leaders attaching the balloons to the components may or may not intersect, depending on the complexity of the assembly drawing, and the arrangement of the balloons relative to the assembly drawing. A designer may manually reposition balloons or adjust balloon-component pairings to adjust for conflicting leaders.

SUMMARY

The present invention relates to ballooning an assembly drawing of a computer aided design. In general, in one aspect, the invention features methods and apparatus, including computer program products, for ballooning that receive a set of anchor points and arrange a set of balloons along a polygon enclosing a region including the set of anchor points. The set of balloons is iterated through, and the balloons in the set of balloons are attached to anchor points in the set of anchor points by leaders. Upon completion of one iteration no two leaders intersect.

Implementations can include one or more of the following. There can be no requirement for checking for conflicting leaders. Arranging a set of balloons along a polygon can include dividing the region including the set of anchor points into at least two sub-regions and arranging the set of balloons along the polygon such that an amount of balloons along a boundary of each sub-region is at least equal to an amount of anchor points included in the sub-region. Iterating through the set of balloons and attaching each balloon in the set of balloons to an anchor point can include iterating through the amount of balloons along the boundary of each sub-region and attaching each balloon to an anchor point included in the sub-region by a leader, without creating intersections among the leaders, where a boundary of a sub-region includes at least a portion of one side of the polygon.

Dividing the region including the set of anchor points can include dividing the region such that each of the sub-regions includes an approximately equal amount of anchor points, or alternatively can include dividing the region such that each of the sub-regions is approximately equal in area. Iterating through the amount of balloons along the boundary of each sub-region can include iterating through the amount of balloons in either a clockwise or a counterclockwise direction of iteration, where a first balloon in the iteration has at most one neighboring balloon on the boundary of the sub-region, and a last balloon in the iteration has at most one neighboring balloon on the boundary of the sub-region.

Iterating through the amount of balloons along the boundary of each sub-region comprise, for each balloon in the amount of balloons, can include iterating through the anchor points included in the sub-region that are not already attached to a balloon by a leader, and for each such anchor point calculating a value of an angle formed by an intersection of a line extending between the balloon and the anchor point and the side of the polygon along which the balloon is positioned, comparing the calculated values for each such anchor point, and attaching the balloon to an anchor point using a leader based on the comparison of the calculated values.

In one implementation the angle is a non-reflex angle formed between a segment connecting the balloon to the anchor point and a ray that extends along a side of the polygon along which the balloon is positioned in a direction opposite to the direction of iteration, the smallest non-reflex angle is determined and the balloon attached to an anchor point corresponding to the smallest non-reflex angle. In another implementation, the angle is a reflex angle formed between a segment connecting the balloon to the anchor point and a ray that extends along a side of the polygon along which the balloon is positioned in a direction opposite to the direction of iteration, the largest reflex angle is determined the balloon is attached to an anchor point corresponding to the largest reflex angle. In another implementation, the angle is a non-reflex angle formed between a segment connecting the balloon to the anchor point and a ray that extends along a side of the polygon along which the balloon is positioned in the direction of iteration, the largest non-reflex angle is determined and the balloon is attached to an anchor point corresponding to the largest non-reflex angle. In another implementation, the angle is a reflex angle formed between a segment connecting the balloon to the anchor point and a ray that extends along a side of the polygon along which the balloon is positioned in the direction of iteration, the smallest reflex angle is determined and the balloon is attached to an anchor point corresponding to the smallest reflex angle.

There can be an equal number of balloons and anchor points and upon completion of one iteration each balloon in the set of balloons can be attached to one anchor point in the set of anchor points by a leader.

In general, in another aspect, the invention features methods and apparatus, including computer program products, for attaching balloons to anchor points. A set of balloons is arranged along a substantially straight line, and a set of anchors points is received positioned on either or both sides of the straight line. The balloons in the set of balloons are iterated through, selecting an outermost balloon for a first iteration and progressively selecting a next adjacent balloon for each successive iteration until all balloons in the set of balloons have been iterated through. For each balloon, the anchor points that are not already attached to a balloon by a leader are iterated through, and for each such anchor point a value of an angle formed by an intersection of a line extending between the balloon and the anchor point and the substantially straight line is calculated. The calculated values for each such anchor point are compared, and the balloon is attached to an anchor point using a leader based on the comparison of the calculated values. Upon completion of one iteration through the balloons no two leaders intersect.

Implementations can include one or more of the following. In one implementation the angle is a non-reflex angle formed between a segment connecting the balloon to the anchor point and a ray that extends along the straight line in a direction away from a second outermost balloon situated on the substantially straight line, the smallest non-reflex angle is determined and the balloon attached to an anchor point corresponding to the smallest non-reflex angle.

In another implementation, the angle is a reflex angle formed between a segment connecting the balloon to the anchor point and a ray that extends along the straight line in a direction away from a second outermost balloon situated on the substantially straight line, the largest reflex angle is determined the balloon is attached to an anchor point corresponding to the largest reflex angle.

In another implementation, the angle is a non-reflex angle formed between a segment connecting the balloon to the anchor point and a ray that extends along the straight line in a direction toward a second outermost balloon situated on the substantially straight line, the largest non-reflex angle is determined and the balloon is attached to an anchor point corresponding to the largest non-reflex angle.

In another implementation, the angle is a reflex angle formed between a segment connecting the balloon to the anchor point and a ray that extends along the straight line in a direction toward a second outermost balloon situated on the substantially straight line, the smallest reflex angle is determined and the balloon is attached to an anchor point corresponding to the smallest reflex angle.

The substantially straight line can be a substantially horizontal line, a substantially vertical line or an angled line. There can be an equal number of balloons and anchor points and upon completion of one iteration each balloon in the set of balloons can be attached to one anchor point in the set of anchor points by a leader.

In general, in another aspect, the invention features methods and apparatus, including computer program products, for ballooning. A set of anchor points are received and a set of balloons are arranged along a polygon enclosing a region including the set of anchor points. The region including the set of anchor points is divided into at least two sub-regions and the set of balloons is arranged along the polygon such that an amount of balloons along a boundary of each sub-region is at least equal to an amount of anchor points included in the sub-region. The set of balloons is iterated through and balloons in the set of balloons are attached to anchor points in the set of anchor points by leaders, including iterating through the amount of balloons along the boundary of each sub-region and attaching each balloon to an anchor point included in the sub-region by a leader. A boundary of a sub-region includes at least a portion of a side of the polygon and if the boundary of a sub-region includes portions of two or more sides of the polygon, no two sides of the polygon included in the boundary intersect at an angle of less than 90 degrees or greater than 180 degrees.

Implementations can include one or more of the following. Iterating through the amount of balloons along the boundary of each sub-region can include iterating through the amount of balloons in either a clockwise or a counterclockwise direction of iteration, where a first balloon in the iteration has at most one neighboring balloon on the boundary of the sub-region, and a last balloon in the iteration has at most one neighboring balloon on the boundary of the sub-region. For each balloon in the amount of balloons, the anchor points included in the sub-region that are not already attached to a balloon by a leader are iterated through in the direction of iteration, and for each such anchor point a value of an angle formed by an intersection of a line extending between the balloon and the anchor point and the side of the polygon along which the balloon is positioned is calculated. The calculated values for each such anchor point are compared, the balloon is attached to an anchor point using a leader based on the comparison of the calculated values.

In general, in another aspect, the invention features methods and apparatus, including computer program products, for ballooning. A set of anchor points is received. A balloon-placement polygon is defined, the balloon-placement polygon enclosing a region including some or none of the anchor points. An outer-polygon is defined, the outer-polygon enclosing a region including the set of anchor points and the balloon-placement polygon. The region enclosed by the outer-polygon is divided into two or more sub-regions, where each sub-region includes at least a portion of one side of the balloon-placement polygon. A set of balloons is arranged along the balloon-placement polygon such that an amount of balloons included in a sub-region is at least equal to an amount of anchor points included in the sub-region. For each sub-region, the amount of balloons included in the sub-region is iterated through and attached to the anchor points included in the sub-region using leaders.

Implementations can include one or more of the following. Defining a balloon-placement polygon can include receiving a user input specifying a shape of a polygon. For each sub-region, iterating through the amount of balloons included in the sub-region and attaching the balloons to the anchor points can include iterating through the amount of balloons in either a clockwise or a counter-clockwise direction of iteration, where a first balloon in the iteration has at most one neighboring balloon within the sub-region and a last balloon in the iteration has at most one neighboring balloon within the sub-region. For each balloon in the amount of balloons, beginning with the first balloon, the anchor points included in the sub-region that are not already attached to a balloon by a leader are iterated through, and for each such anchor point a value of an angle formed by an intersection of a line extending between the balloon and the anchor point and the side of the balloon-placement polygon along which the balloon is positioned is calculated. The calculated values are compared for each such anchor point, the balloon is attached to an anchor point based on the comparison of the calculated values.

In one implementation the angle is a non-reflex angle formed between a segment connecting the balloon to the anchor point and a ray that extends along a side of the balloon-placement polygon along which the balloon is positioned in a direction opposite to the direction of iteration, the smallest non-reflex angle is determined and the balloon attached to an anchor point corresponding to the smallest non-reflex angle. In another implementation, the angle is a reflex angle formed between a segment connecting the balloon to the anchor point and a ray that extends along a side of the balloon-placement polygon along which the balloon is positioned in a direction opposite to the direction of iteration, the largest reflex angle is determined the balloon is attached to an anchor point corresponding to the largest reflex angle. In another implementation, the angle is a non-reflex angle formed between a segment connecting the balloon to the anchor point and a ray that extends along a side of the balloon-placement polygon along which the balloon is positioned in the direction of iteration, the largest non-reflex angle is determined and the balloon is attached to an anchor point corresponding to the largest non-reflex angle. In another implementation, the angle is a reflex angle formed between a segment connecting the balloon to the anchor point and a ray that extends along a side of the balloon-placement polygon along which the balloon is positioned in the direction of iteration, the smallest reflex angle is determined and the balloon is attached to an anchor point corresponding to the smallest reflex angle.

Dividing the region enclosed by the outer-polygon into two or more sub-regions can include dividing the region enclosed by the outer-polygon into two or more sub-regions where each sub-region includes at least a portion of at most one side of the balloon-placement polygon, and upon completion of one iteration through the set of balloons, no two leaders intersect. There can be no requirement to check for conflicting leaders.

Implementations of the invention can realize one or more of the following advantages. An automatic ballooning technique can be used to attach balloons that are arranged around the perimeter of an assembly drawing to components of the assembly drawing such that no two leaders intersect. Avoiding intersecting leaders creates an aesthetically pleasing, clear and decipherable assembly drawing. Further, the designer is freed from the labor intensive and tedious task of attempting to rearrange balloon positions, or change balloon-component pairings, to undo crossed leaders. A technique for determining which balloon to attach to which component requires just one iteration through a set of balloons, and upon completion of the iteration, the balloons are attached to the components by leaders and no two leaders intersect. Because only one iteration is required, and conflict checking for conflicting (i.e., crossed) leaders is avoided, the technique is efficient and reliable. The technique is particularly advantageous when dealing with substantially large and complex assembly drawings because the complexity of the process is reduced and, in turn, the run-time and cost of ballooning such assembly drawings is reduced.

The processes for automatic ballooning described above avoid the necessity for checking for conflicting leaders upon completion of one or more iterations through the balloons, thereby reducing the complexity of the automatic ballooning process. That is, fewer operations need to be performed in order to balloon an assembly drawing for a CAD design in the absence of conflict checking. Further, as the number of leaders increases, checking for and resolving (i.e., uncrossing) conflicting leaders (e.g., manipulating the positions of the balloons and/or changing the balloon-anchor point pairings) can become a costly operation leading to longer runtimes, e.g. if implemented in software, and the success of resolving all conflicts diminishes. As a result, when ballooning a substantially large and complex assembly drawing, it is particularly desirable and advantageous to avoid checking for and resolving conflicts among leaders. The processes described above avoid conflicting leaders, that is, after a single iteration through the balloons, the balloons are attached to anchor points and there are no two leaders that intersect. Conflict checking and resolving is eliminated, thereby improving the efficiency and reliability of automatic ballooning.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
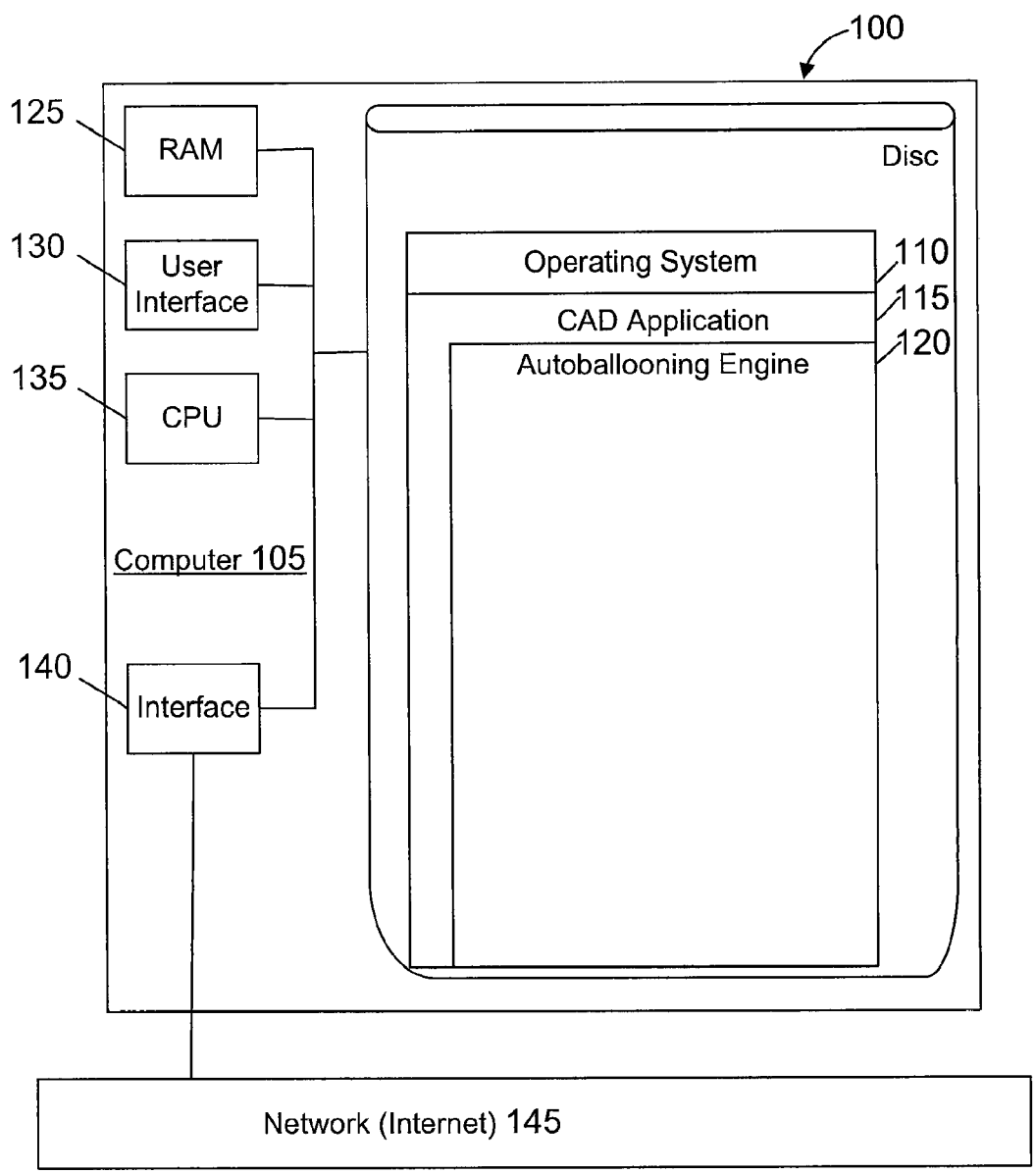
FIG. 1 is a schematic representation of a computer including a CAD application.

Referring to FIG. 1, a CAD application 115 can execute in a computer system 100 executing an operating system 110. An exemplary computer 105 is shown, and includes a random access memory (RAM) 125, a user interface 130, e.g., a computer monitor, mouse and/or keyboard, and a central processing unit (CPU) 135. Optionally, if the computer 105 can connect to other computers and/or devices over a network connection 145, such as an Internet connection, the computer 105 can include an external interface 140. The CAD Application 115 can be, for example, the Autodesk Inventor® software application available from Autodesk, Inc. of San Rafael, Calif.

The CAD application 115 can provide functionality for a user to create an assembly drawing for a CAD design. Within the CAD Application 115, an Autoballooning Engine 120 can function to perform automatic ballooning of an assembly drawing. The Autoballooning Engine 120 can automatically attach balloons to components included in an assembly drawing by leaders, ensuring that no two leaders intersect. Avoiding intersecting leaders can provide a substantially legible and decipherable assembly drawing. In one implementation, the balloons are arranged around a perimeter of an assembly drawing, or along a substantially straight line (e.g., horizontal or vertical) with components of the assembly drawing on either or both sides of the line.

Horizontal Balloon Placement

Figure 2A:
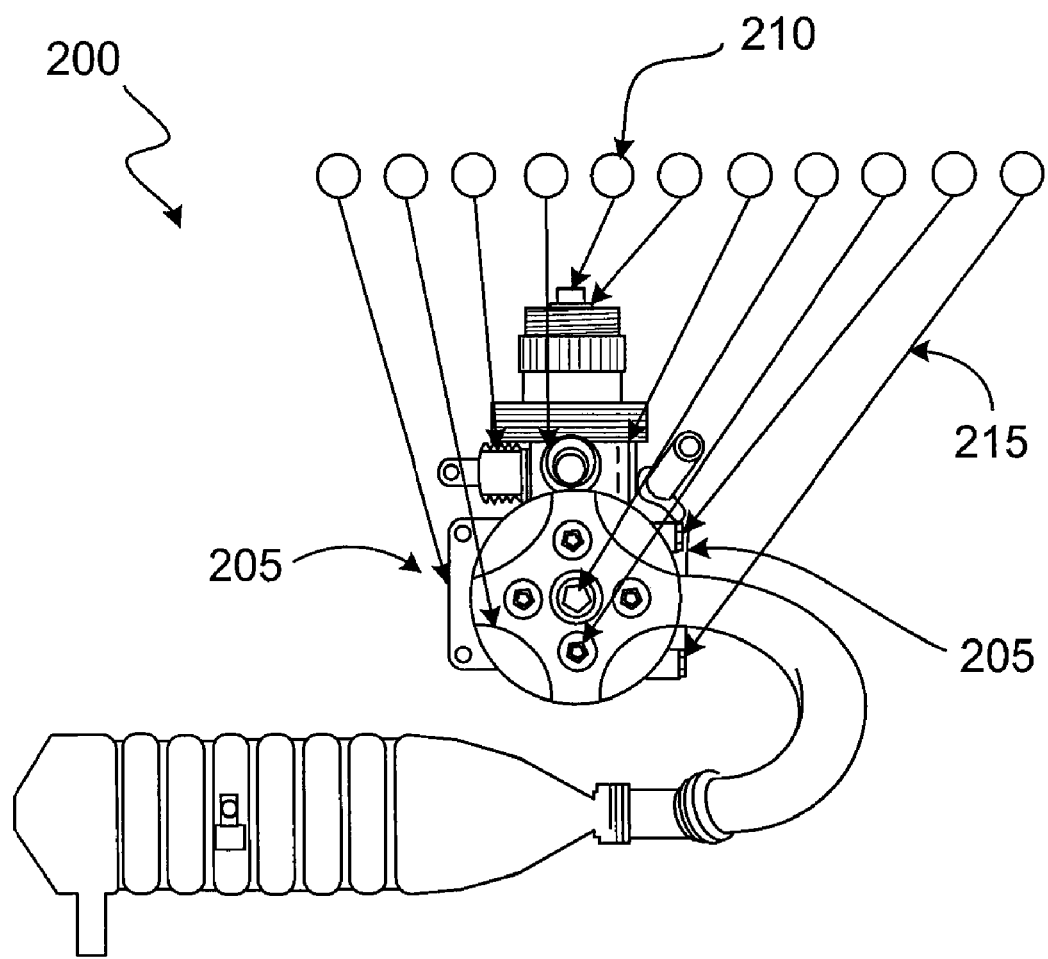
FIG. 2A is a representation of an assembly drawing including balloons positioned along a substantially horizontal line attached to components by leaders.

FIG. 2A shows an example of automatic ballooning performed on an assembly drawing 200 where a set of balloons 210 is arranged along a substantially horizontal line (not shown). The balloons 210 are attached by leaders 215 to components of the assembly drawing 200. In the example shown, the leaders are straight, solid lines extending between the balloons and the components. In other implementations, the leaders 215 can be other configurations, such as broken lines, thin rectangular connectors, a series of dots, or other elements that represent a connection between a balloon and a component.

The leaders 215 are attached to components of the assembly drawing 200 at anchor points 205, i.e., an anchor point exists for each component of the assembly drawing 200 that is to be attached to a balloon 210. In one implementation, if components of the assembly drawing 200 represent solid geometry pieces, an anchor point for a component can be positioned at the centroid of the component. A balloon 210 that is attached by a leader line 215 to a given anchor point 205 identifies the component of the assembly drawing associated with the given anchor point 205. For example, each balloon 210 can include a label, such as a letter or number, and a legend can be provided that identifies the name of a component identified by each such label, e.g., A=nut, B=bolt.

Figure 3:
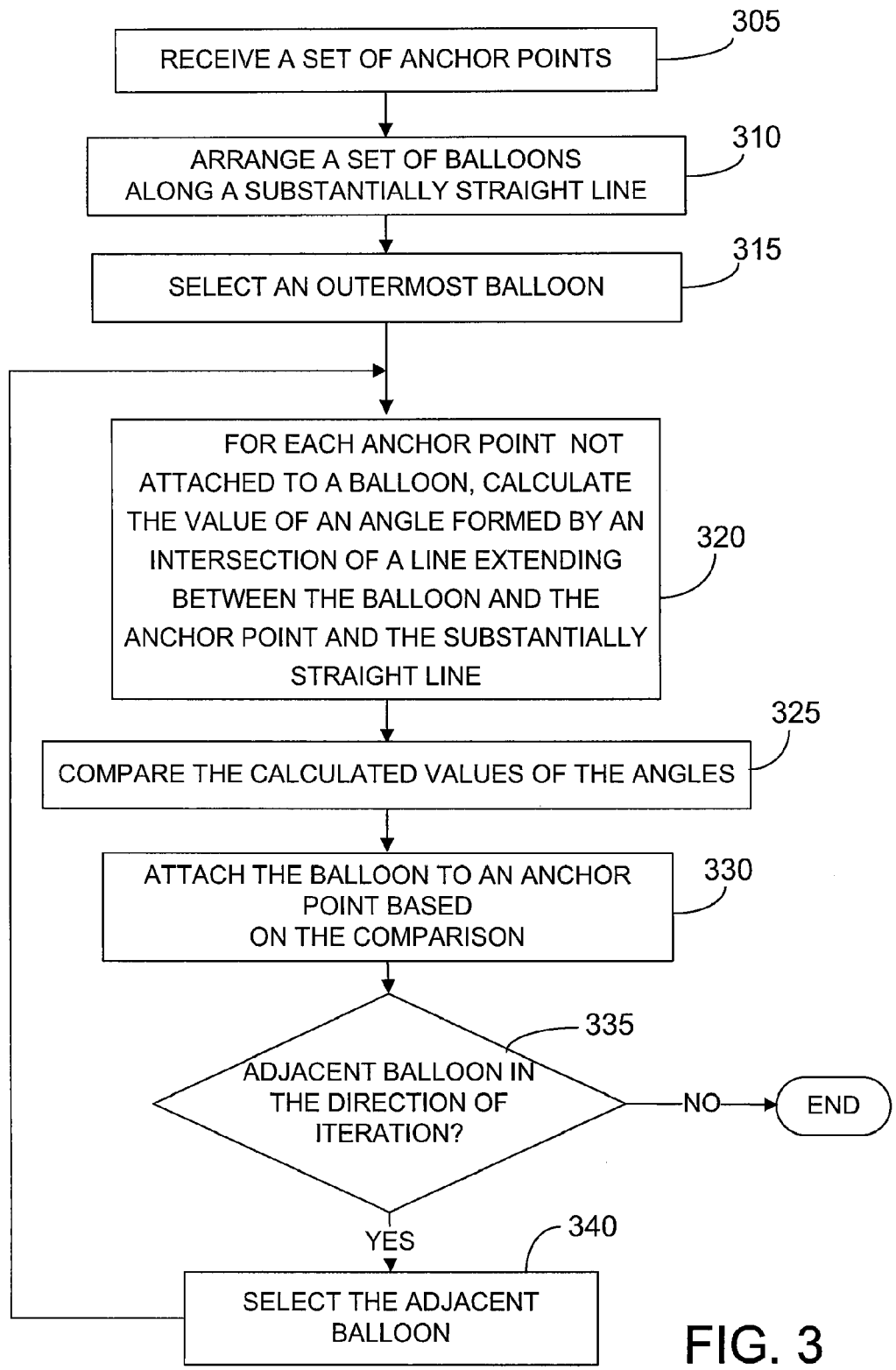
FIG. 3 is a flowchart showing a process for attaching balloons to anchor points.

FIG. 3 is a flowchart showing a process 300 for automatic ballooning when a set of balloons is arranged along a substantially straight line. The line can be horizontal, as shown in FIG. 2A, or can be vertical or positioned at an angle. For exemplary purposes, the process 300 will be described in the context of attaching the balloons 210 of the assembly drawing 200 to the anchor points 205 associated with the components included in the assembly drawing 200.

Figure 2B:
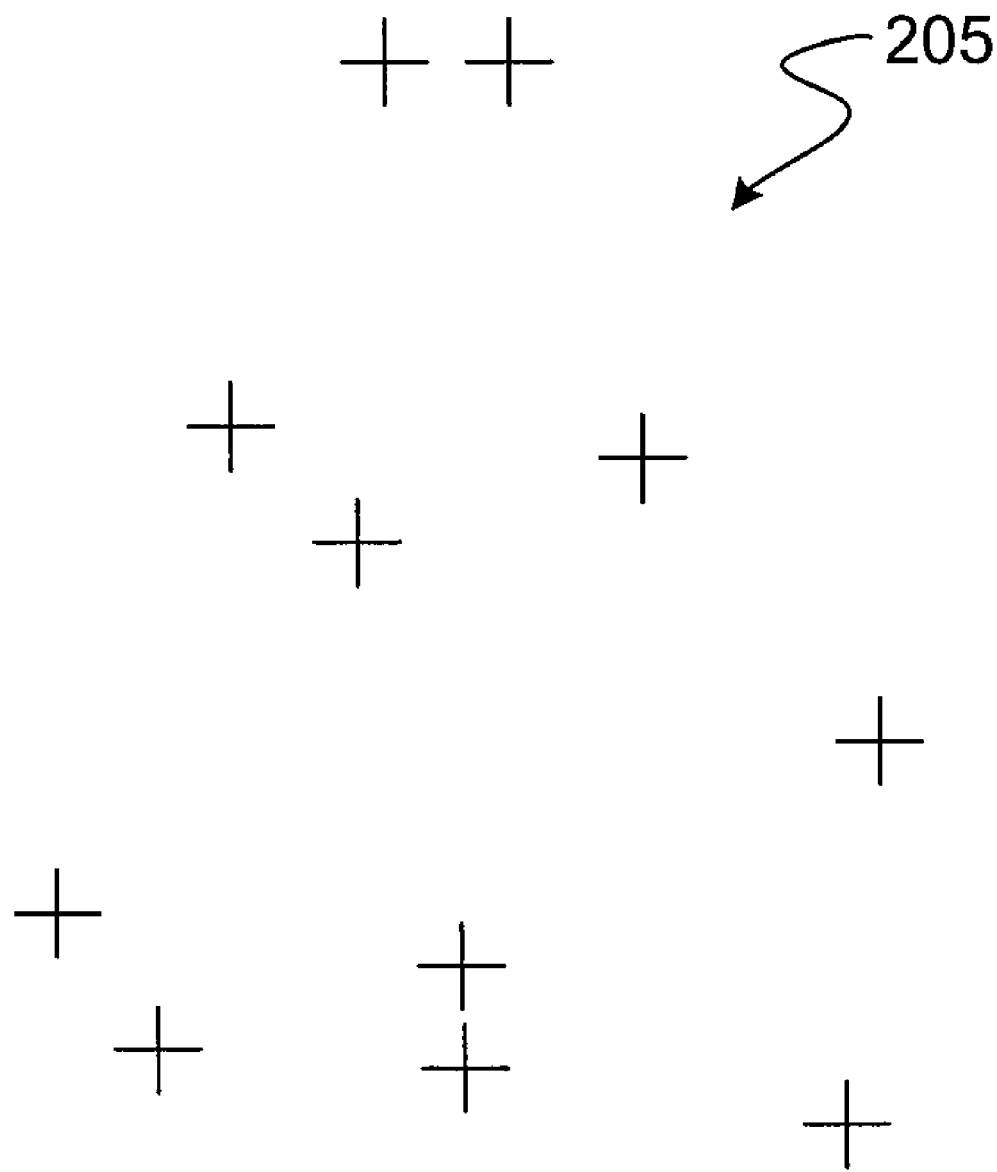
FIGS. 2B-2F are representations of anchor points, balloons and leaders and illustrate a process of attaching anchor points to balloons along a substantially horizontal line.

Referring to FIG. 2B, a set of anchor points 205 is received (step 305). The anchor points 205 shown in FIG. 2B correspond to the points of attachment of the leaders 215 to the components of the assembly drawing 200 in FIG. 2A, however, for illustrative purposes, only the set of anchor points 205 is shown, and the assembly drawing 200 is omitted.

Figure 2C:
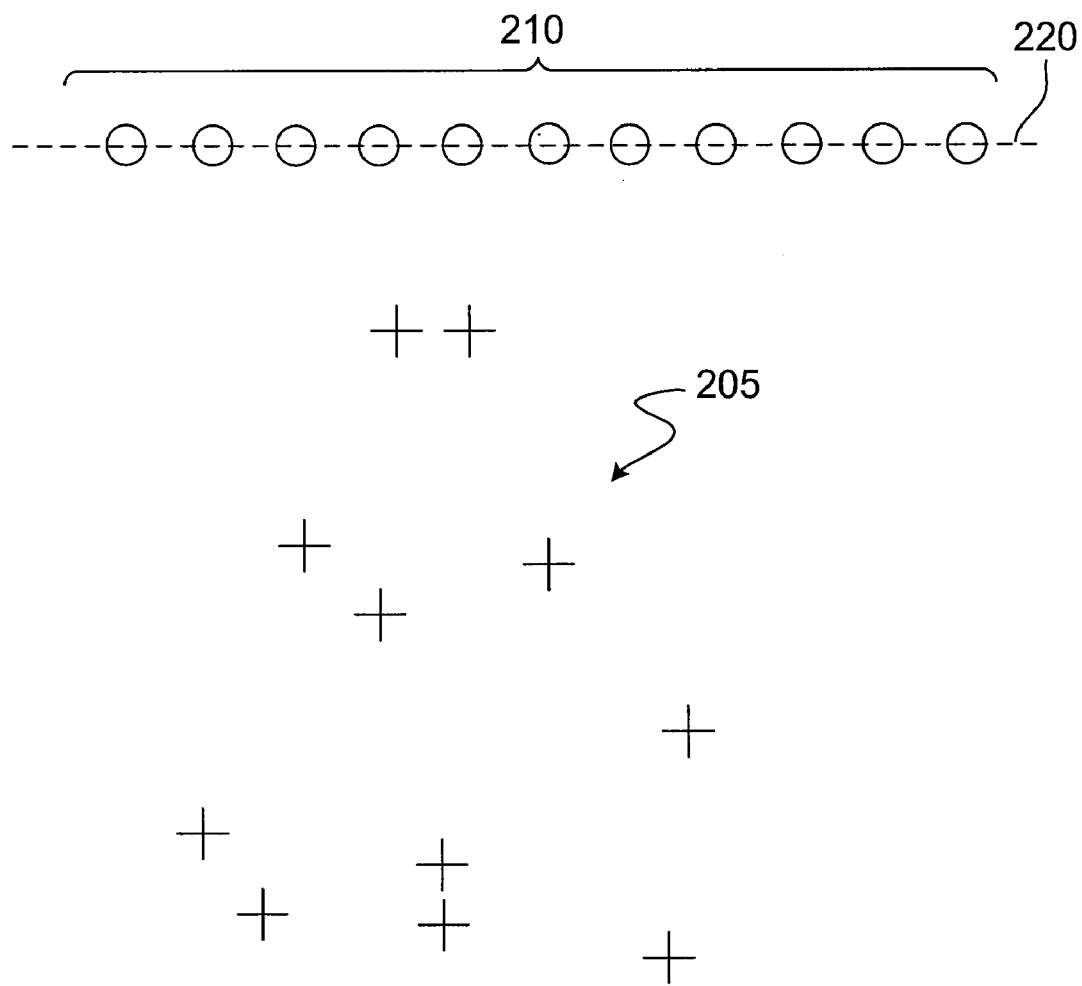

Referring to FIG. 2C, a set of balloons 210 is arranged along a substantially straight line (step 310). In this example, the straight line is a substantially horizontal line, which is shown as line 220 for illustrative purposes. The balloons 210 can be generated by the CAD application 115 using conventional techniques, and can be, as shown, substantially circular in shape, although balloons can be other configurations, such as square, triangular, etc. The number of balloons 210 generated can be equal to the number of anchor points 205, so that each anchor point 205 can be attached to a balloon 210. However, an implementation can permit more or fewer balloons 210 to be generated, for example, upon receiving user input specifying the number of balloons to generate, or a preferred ratio of balloons to anchor points. If more or fewer balloons are designated, user input or default settings can be used to determine which anchor points 205 have or do not have balloons associated therewith.

An outermost balloon is selected from the set of balloons 210 as a first balloon to be attached to an anchor point from the set of anchor points 205 (step 315). The selection of a particular outermost balloon as a first balloon to be attached to an anchor point also selects a direction of iteration. That is, the direction of iteration is along the horizontal line 220 from the selected outermost balloon to an opposing other outermost balloon. For example, referring to FIG. 2D, if the left outermost balloon 210a is selected as the first balloon to be attached to an anchor point (as in the present example), then the direction of iteration 225 is from left to right along the horizontal line 220. Whereas, if the right outermost balloon 210k is selected as the first balloon, then the direction of iteration is from right to left along the horizontal line 220.

Figure 2D:
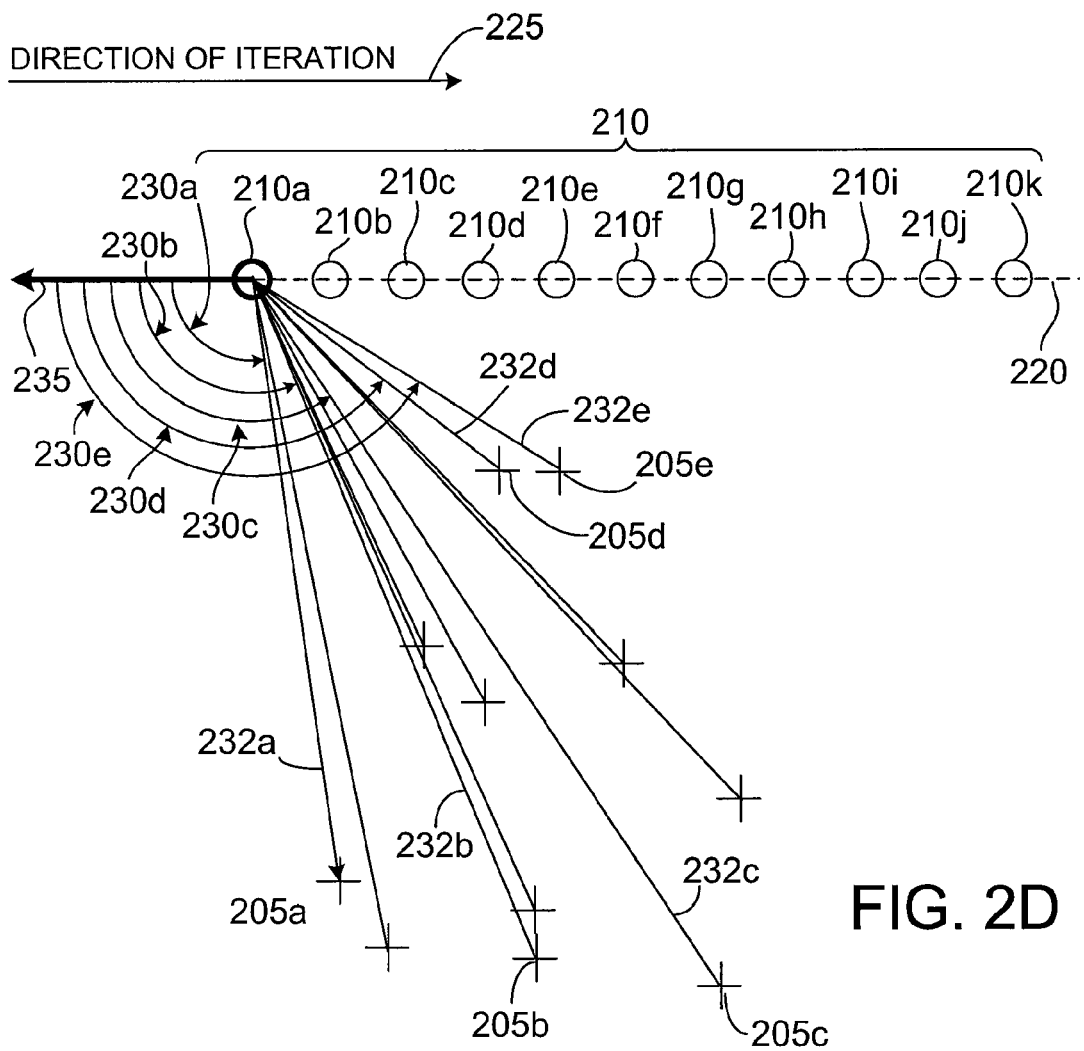
Figure 2E:
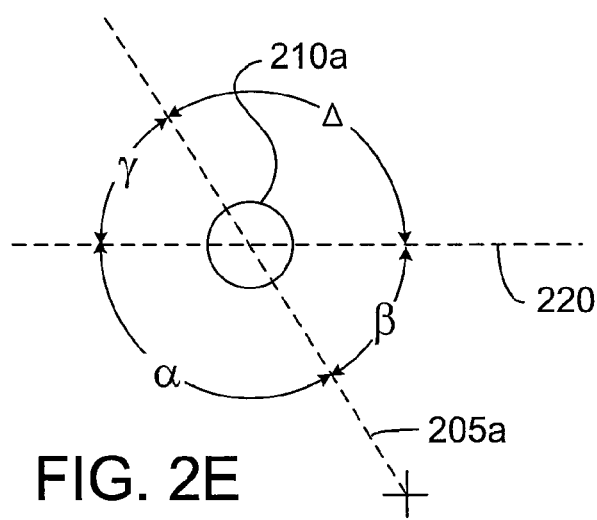

An angle can be formed between an intersection of a line extending between the balloon 210 and an anchor point 205 and the substantially straight line, i.e., horizontal line 220. An enlarged portion of FIG. 2D is shown in FIG. 2E. FIG. 2E shows four possible angles formed by the intersection of a line extending between the balloon 210a and an anchor point 205a and the horizontal line 220: angles $\alpha$, $\beta$, $\Delta$ and $\gamma$. Either angle, or another angle, can be selected with respect to each anchor point 205, and the angles compared to one another. The decision as to which anchor point 205 to attach to the balloon 210 is based on the comparison. For example, in one implementation, the non-reflex angle $\alpha$ that is formed between: (1) a segment connecting a balloon 210 to an anchor point 200; and (2) a ray that extends from the balloon 210 along a substantially straight line in a direction opposite to the direction of iteration 225, is calculated for each anchor point. A non-reflex angle is an angle that is less than 180°, as compared to a reflex angle that is greater than 180°. In the present example, referring to the selected first balloon 210a and anchor point 205a an angle 230a is formed between a segment 232a connecting the balloon 210a to the anchor point 205a, and a ray 235 that extends from the balloon 210 along a substantially straight line in a direction opposite to the direction of iteration 225. For each anchor point in the set of anchor points 205, that is not already attached to a balloon 210, such an angle is calculated (step 320).

For example, the non-reflex angles 230a-230e are shown that correspond to the angles formed between the ray 235 and the segments 232a-e between the balloon 210a and the anchors 205a-e respectively. Since none of the anchor points 205 have yet been attached to a balloon 210, a non-reflex angle is calculated with respect to each of the anchor points in the set of anchor points 205. The non-reflex angles 230 for each anchor point 205 are compared, and the balloon 210a is attached to the anchor point based on the comparison, i.e., the anchor point that corresponds to the smallest non-reflex angle (step 330). In the present example, the smallest angle is angle 230a, which corresponds to anchor point 205a. Accordingly, the balloon 210a is attached to the anchor point 205a. Only a single iteration through the anchor points 205 is required before a decision is made as to which anchor point 205 to attach to the balloon 210a.

Figure 4:
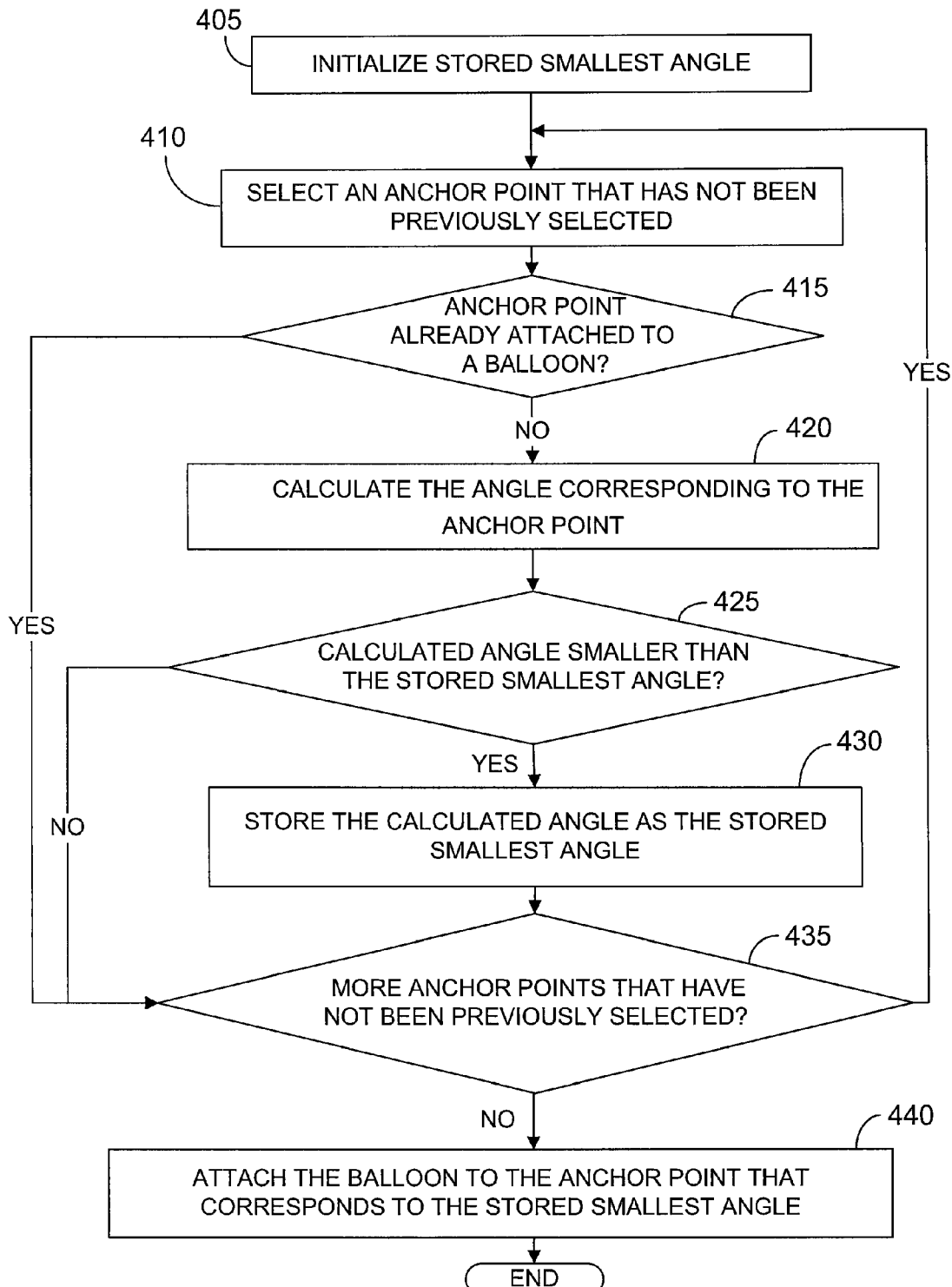
FIG. 4 is a flowchart showing a process for selecting which anchor point to attach to a balloon.

The determination as to which non-reflex angle is the smallest can be made according to any convenient technique. FIG. 4 shows a flowchart illustrating one implementation of a process 400 for making the determination. A value is stored in a memory that represents a smallest angle, referred to as the stored smallest angle, and the value is originally initialized to something unreasonably large (step 405), for example, a value greater than 360 degrees. An anchor point that has not been previously selected in the iteration for the balloon 210a is selected as a potential anchor point to be attached to the balloon 210a (step 410). A check is performed to determine if the selected anchor point is already attached to a balloon (step 415). If the anchor point is already attached to a balloon ("Yes" branch of decision step 415), then a check is performed to determine if there are more anchor points that have not been previously selected (step 435). If one or more such anchor points exist, then the process returns to step 410 and another anchor point that has not been previously selected is selected as a potential anchor point to be attached to the selected balloon 210a.

If the selected anchor point, e.g., anchor point 205a, is not attached to a balloon ("No" branch of decision step 415), then a value of the non-reflex angle 230a formed between the segment 232a connecting the balloon 210a to the anchor point 205a and the ray 235 is calculated (step 420). A check is performed to determine if the calculated value, i.e., the value of angle 230a, is smaller than the stored smallest angle (step 425). If the calculated value, i.e., the value of angle 230a, is smaller than the stored smallest angle ("Yes" branch of decision step 425), then the calculated value is stored as the stored smallest angle, replacing the initial stored smallest angle (step 430). If the calculated value is not smaller than the stored smallest angle ("No" branch of decision step 425), then the stored smallest angle remains unchanged.

If there are additional anchor points that have not previously been selected as a potential anchor point to be attached to the balloon ("Yes" branch of decision step 435), then the process returns to step 410 and one such anchor point is selected. The process of calculating a corresponding angle, and comparing the angle to the stored smallest angle is repeated, which process continues until all anchor points in the set of anchor points 205 have been selected. Once there are no more anchor points to select ("No" branch of decision step 435), then the balloon 210a is attached to the anchor point that corresponds to the current stored smallest angle (step 440), which in this example is the anchor point 205a corresponding to the stored smallest angle 230a.

Referring again to FIG. 3, after attaching the balloon 210a to the anchor point 205a (step 330), a determination is made as to whether there is an adjacent balloon in the direction of iteration 225 (step 335). If there is an adjacent balloon, such as balloon 210b in the present example ("Yes" branch of decision step 335), then the adjacent balloon 210b is selected (step 340) and steps 320 to 330 are repeated for the selected balloon 210b. The process continues until there are no more adjacent balloons in the direction of iteration, i.e., once all balloons 210a-k have been iterated through, ("No" branch of decision step 335), at which point the process ends.

Figure 2F:
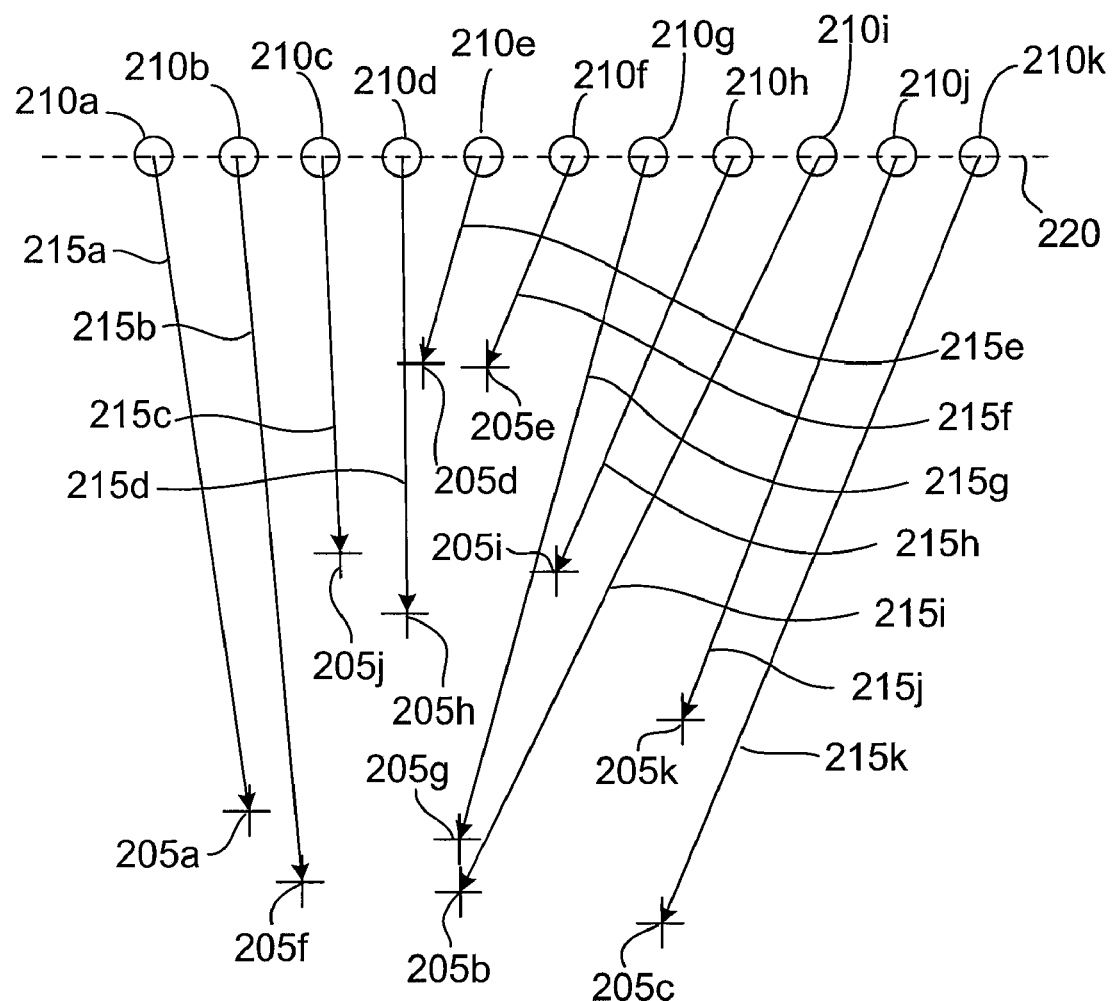

FIG. 2F shows the result of the automatic ballooning process 300 once all of the balloons 210a-k have been iterated through and attached to an anchor point 205a-k. Note that no two leaders 215a-k intersect after the one iteration through the balloons 210a-k, and therefore no two leaders 215 intersected at any time throughout the process. By always selecting the anchor point 205 associated with the smallest angle 230 to attach to a balloon 210, the leaders 215 will not intersect, eliminating the necessity for conflict checking, i.e., checking for conflicting leaders, and eliminating the necessity to adjust for any such conflicts, i.e., by manually or otherwise repositioning the balloons or changing the balloon-anchor point pairings.

In another implementation, a reflex angle formed between a ray extending from a balloon 210 in a direction opposite to the direction of iteration 225 and a segment connecting the balloon 210 to an anchor point 205 can be calculated, i.e., as compared to calculating the non-reflex angle. For example, in FIG. 2E, the reflex angle is represented by the sum of the angles β, Δ and γ. In this implementation, the balloon 210 is attached to the anchor point 205 corresponding to the largest such angle. In yet another implementation, a non-reflex angle formed between a ray extending from a balloon 210 in the direction of iteration 225 (as opposed to extending opposite to the direction of iteration) and a segment connecting the balloon 210 to an anchor point 205 can be calculated. For example, in FIG. 2E, this angle corresponds to angle β. In this implementation, the balloon 210 is attached to the anchor point 205 corresponding to the largest such angle. Alternatively, the reflex angle formed between the ray extending from the balloon 210 in the direction of iteration 225 and a segment connecting the balloon 210 to an anchor point 205 can be calculated, and the balloon 210 can be attached to the anchor point 205 corresponding to the smallest such angle. For example, in FIG. 2E, this angle corresponds to the sum of the angles Δ, γ and Δ.

Vertical Balloon Placement

Figure 5A:
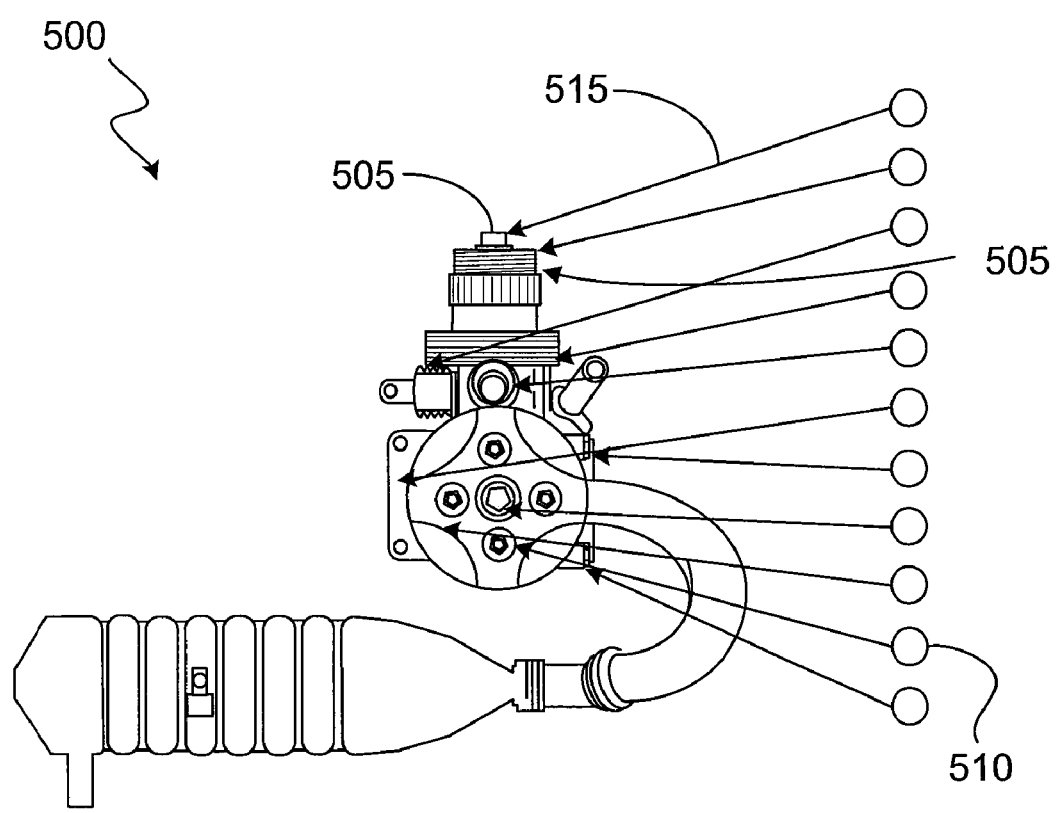
FIG. 5A is a representation of an assembly drawing including balloons positioned along a substantially vertical line attached to components by leaders.
Figure 5B:
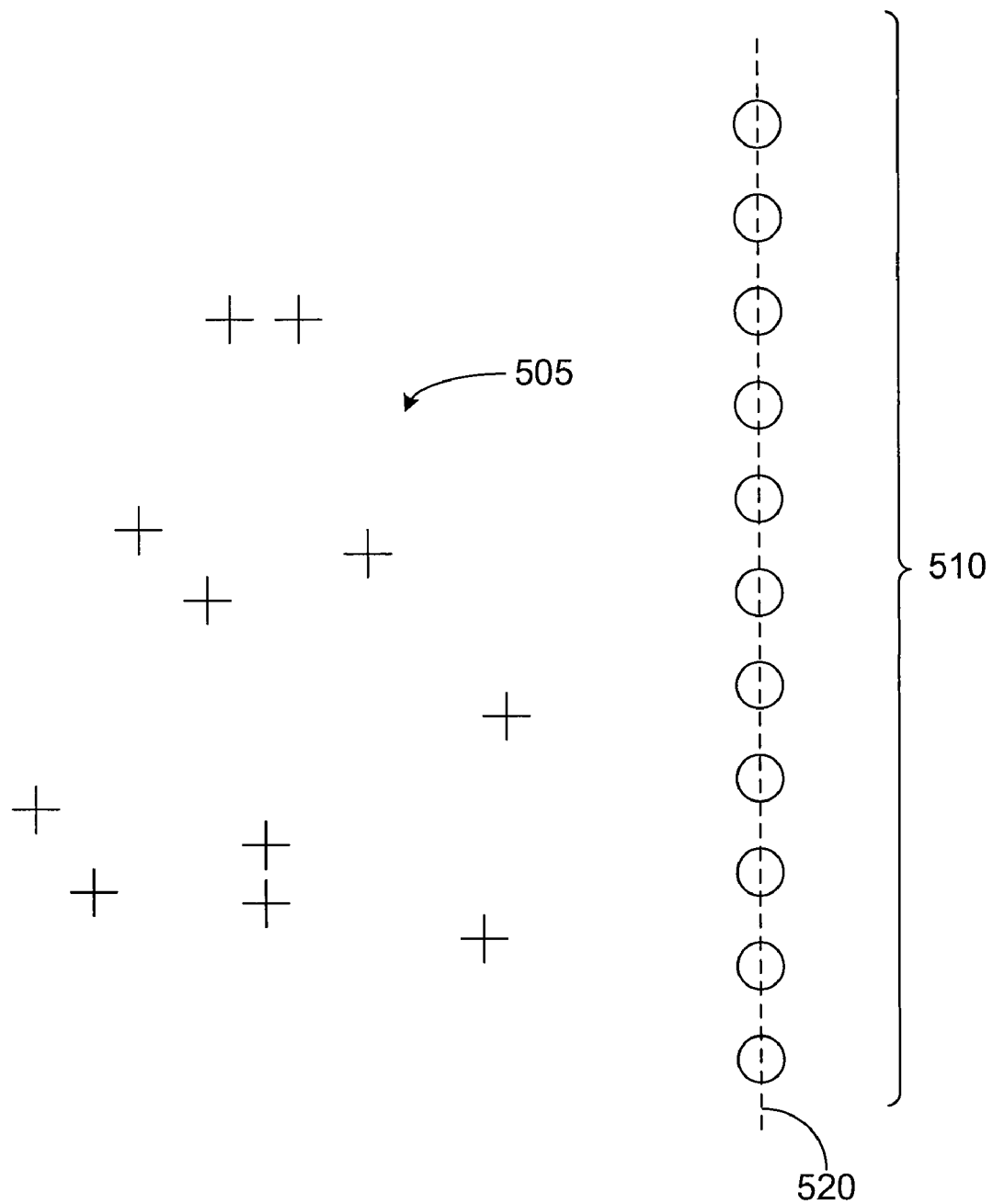
FIGS. 5B-5D are representations of anchor points, balloons and leaders and illustrate a process of attaching anchor points to balloons along a substantially vertical line.
Figure 5C:
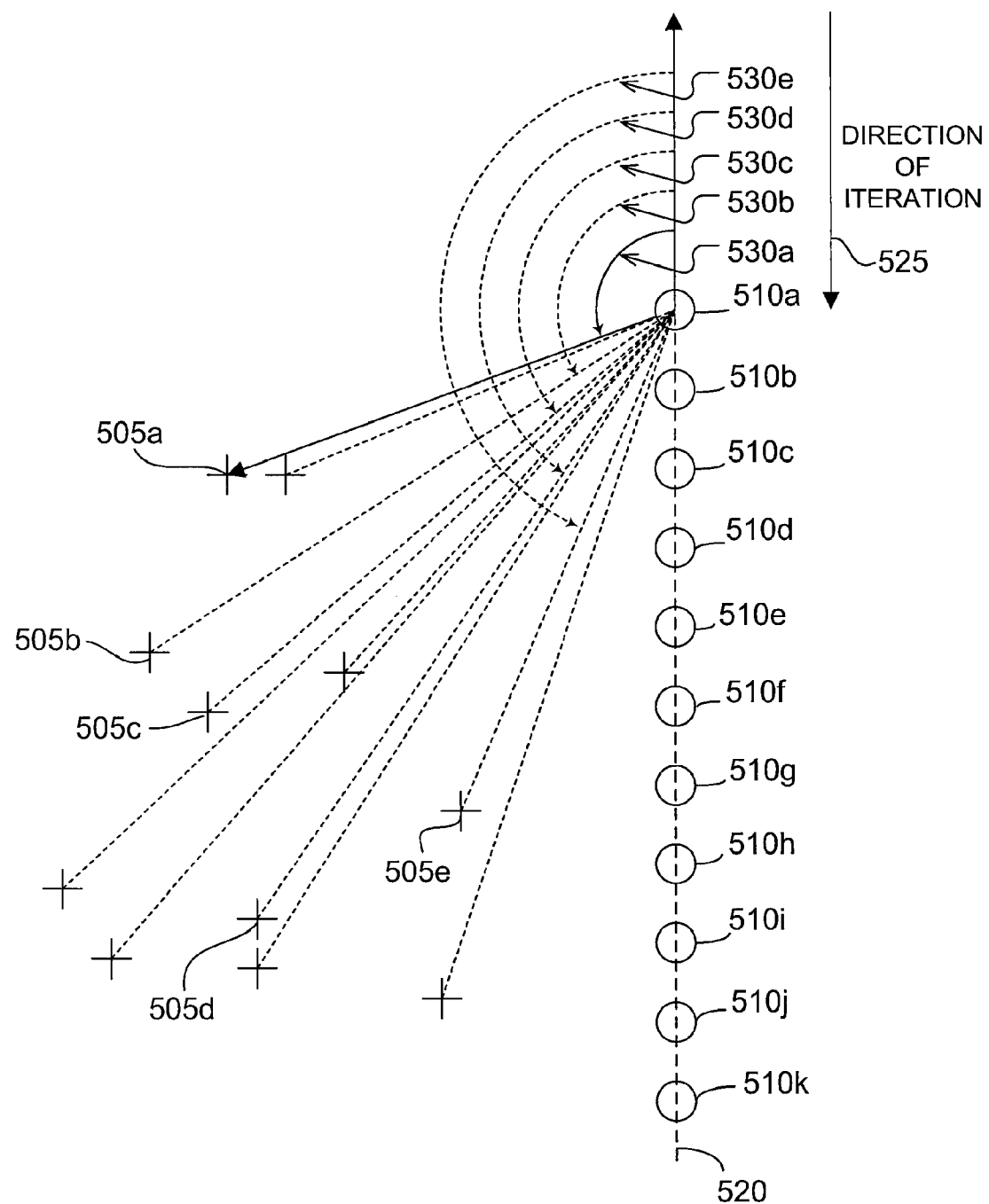

FIG. 5A shows an example of a result of automatic ballooning, wherein the balloons 510 are positioned along a substantially vertical line (not shown). The process 300 shown in FIG. 3 and described above in reference to FIGS. 2A-F can be used to attach the balloons 510 to the anchor points 505. That is, referring to FIG. 5B, a set of anchor points 505 is received (step 305), and the set of balloons 510 is arranged along a substantially straight line (step 310), such as vertical line 520. Referring to FIG. 5C, an outermost balloon is selected from the set of balloons 510 as a first balloon to be attached to an anchor point from the set of anchor points 505 (step 315), for example, the upper outermost balloon 510a. The direction of iteration 525 is therefore from top to bottom. In one implementation, a non-reflex angle formed between a segment connecting the balloon 510a to an anchor point, such as anchor point 505a, and a ray 535 that extends from the balloon 510a along a substantially straight line in a direction opposite to the direction of iteration 535 is calculated (step 320). For example, non-reflex angles 530a-e are calculated with respect to anchor points 505a-e respectively. Since none of the anchor points 505 have yet been attached to a balloon 510, a non-reflex angle is calculated for each anchor point 505a-k. As discussed above, other angles (e.g., see FIG. 2E) can be calculated in the alternative, e.g., the reflex angle.

Figure 5D:
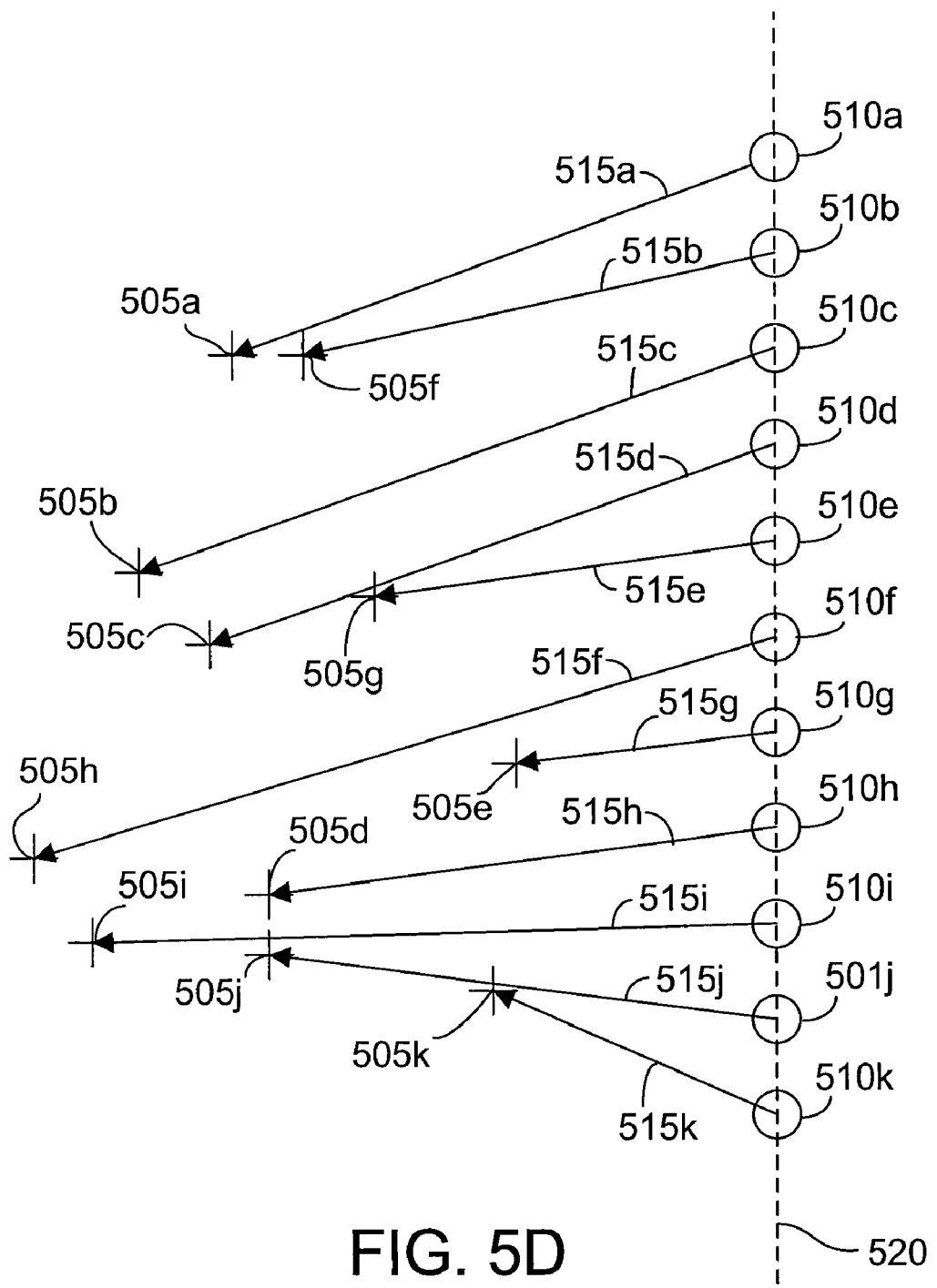

The balloon 510a is attached to the anchor point 505 corresponding to the smallest non-reflex angle (step 330), in this example, anchor point 505a. Starting with the next adjacent balloon 510b, each of the remaining balloons 510b-k are iterated through and attached to corresponding anchor points 505, based on the calculation of the smallest non-reflex angle. FIG. 5D shows the result after a single iteration through the set of balloons 510, where each balloon 510 is attached to an anchor point 505 by a leader line 515, and no two leaders 515 intersect.

Angled Balloon Placement

As mentioned above, a substantially straight line along which balloons are arranged can be neither horizontal nor vertical. Further, a received set of anchor points may be situated on one or both sides of the substantially straight line. Additionally, although in some instances it may be aesthetically pleasing, the balloons do not have to be arranged at regular intervals along the substantially straight line.

Figure 6A:
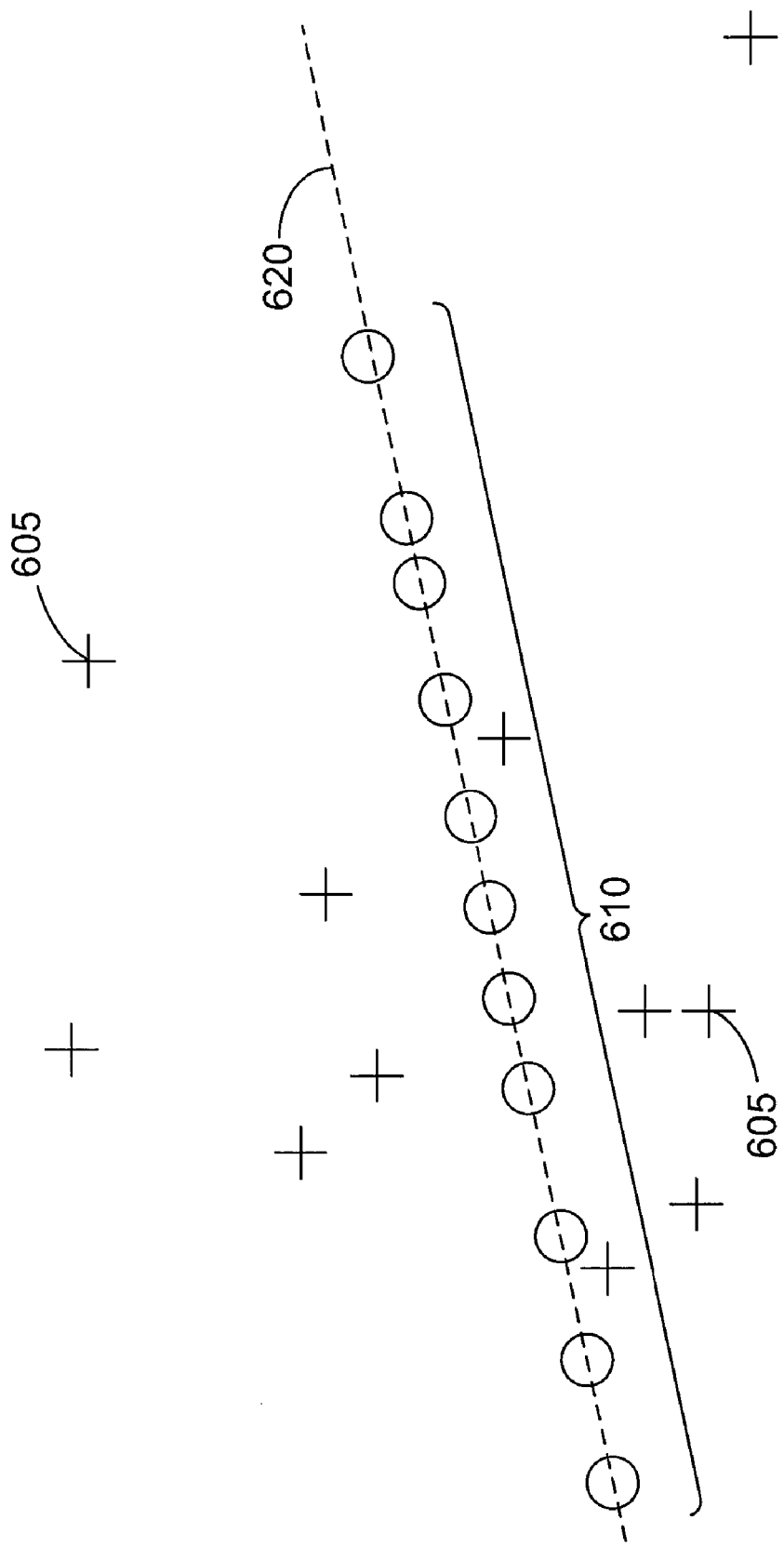
FIGS. 6A-6C are representations of anchor points, balloons and leaders and illustrate a process of attaching anchor points to balloons along a substantially straight, angled line.
Figure 6B:
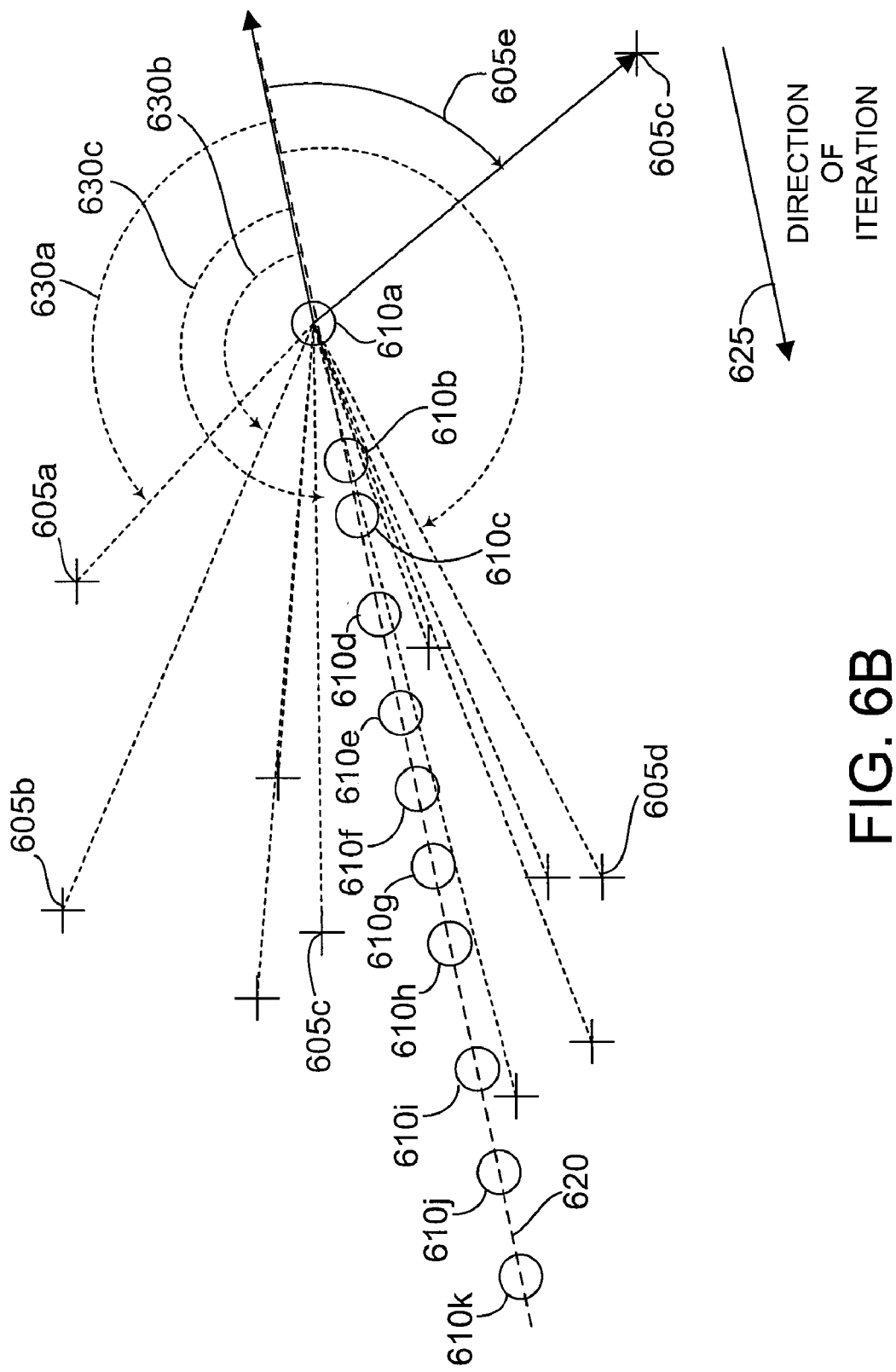
Figure 6C:
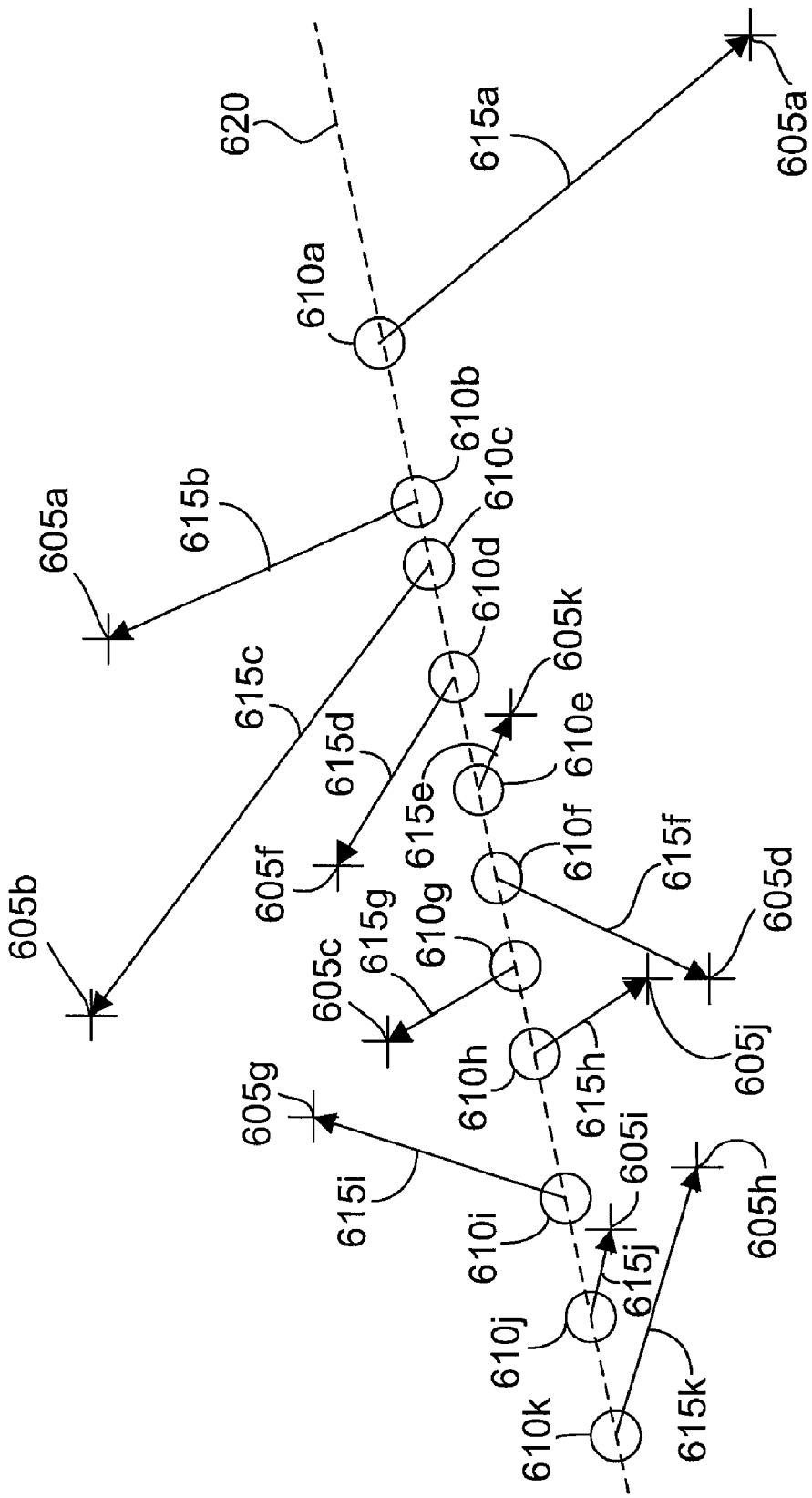

FIGS. 6A-C illustrate an example of automatic ballooning in which balloons 610 are arranged at irregular intervals along an angled line 620 with anchor points 605 situated on both sides of the line 620. The process 300 shown in FIG. 3 described above in reference to horizontal and vertical placement of balloons can also be used in this example. That is, the set of anchor points 605 is received (step 305). The set of balloons 610 is arranged along a substantially straight line (step 310), which is angled line 620 in the present example.

An outermost balloon is selected from the set of balloons 610 as a first balloon to be attached to an anchor point from the set of anchor points 605 (step 315). Referring to FIG. 6B, in the present example, upper, right outermost balloon 610a is selected, and the resulting direction of iteration 625 is from right to left. For each anchor point not attached to a balloon 610, the value of an angle formed by an intersection of a line extending between the balloon and the anchor point and the line 620 is calculated (step 320). In one implementation, a value of a non-reflex angle formed between a segment connecting the balloon 610a to an anchor point and a ray 635 that extends from the balloon 610a along a substantially straight line in a direction opposite to the direction of iteration 625 is calculated for each anchor point. The angles are compared (step 325), and based on the comparison the balloon 610a is attached to an anchor point 605 (step 330). In the present example, since the non-reflex angles are calculated, the comparison determines the smallest non-reflex angle, and the balloon 610a is attached to the anchor point 605 corresponding to the smallest non-reflex angle, in this example, anchor point 605a.

A check is performed to determine whether there is an adjacent balloon 610 in the direction of iteration 625 (step 335). If there is an adjacent balloon 610, i.e., balloon 610b ("Yes" branch of decision step 335), then the adjacent balloon 610b is selected (step 340) and steps 320 to 330 are repeated. If there is no adjacent balloon, i.e., balloons 610a-k have all been iterated through ("No" branch of decision step 225), then the process 300 ends.

FIG. 6C shows the result of a single iteration through the balloons 610a-k. Each balloon 610 is attached to an anchor point 605 by a leader line 615 and no two leaders 615 intersect.

Around Placement Automatic Ballooning

In the examples considered so far, the balloons were arranged along a substantially straight line and the anchor points were on either or both sides of the line. Automatic ballooning is also possible when the balloons are arranged along a shape, e.g., a rectangle, that encloses a region including a set of anchor points.

Rectangular Around Placement

Figure 7A:
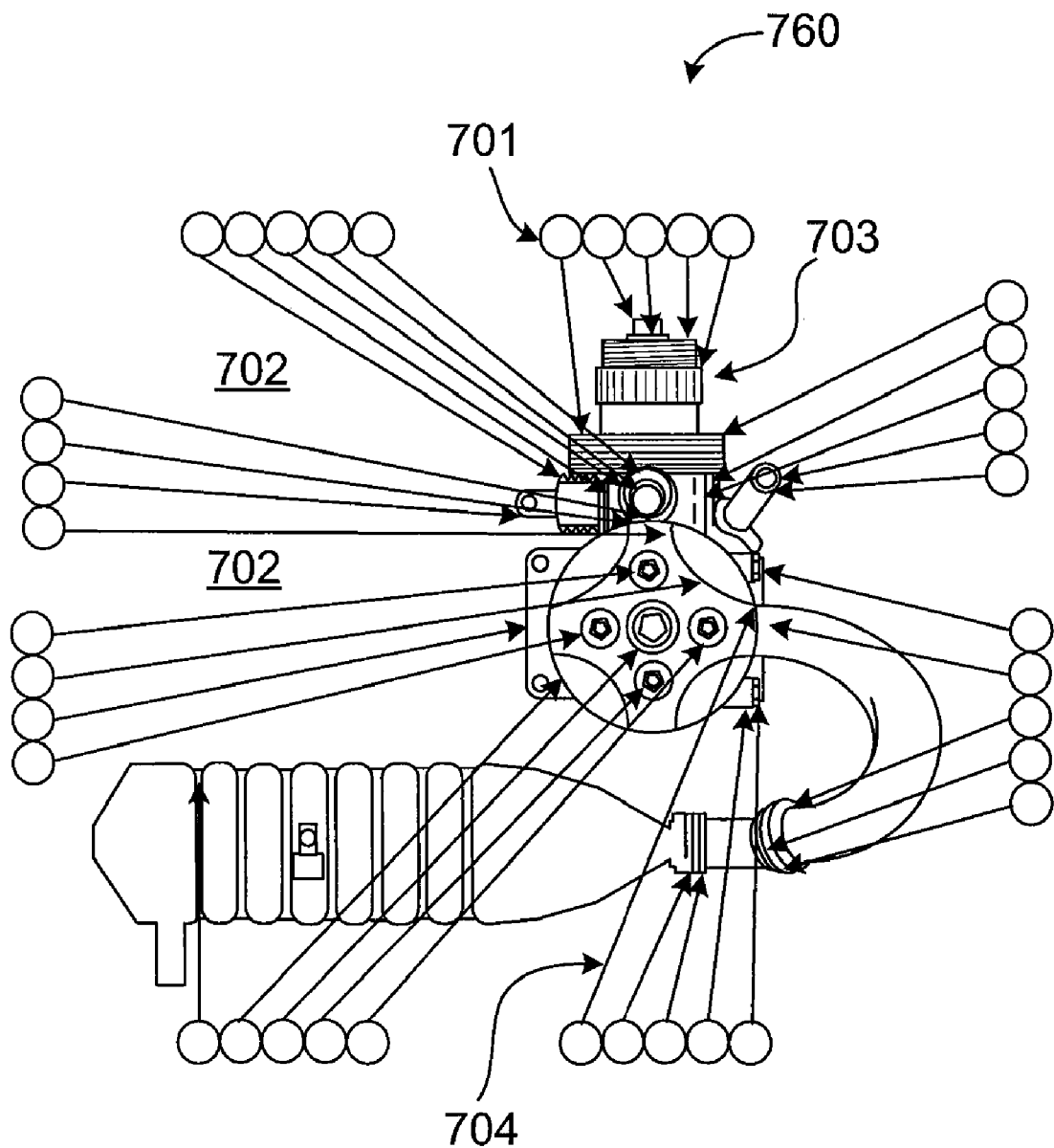
FIG. 7A is a representation of an assembly drawing including balloons positioned about the perimeter of the assembly drawing along substantially horizontal and vertical lines.
Figure 7B:
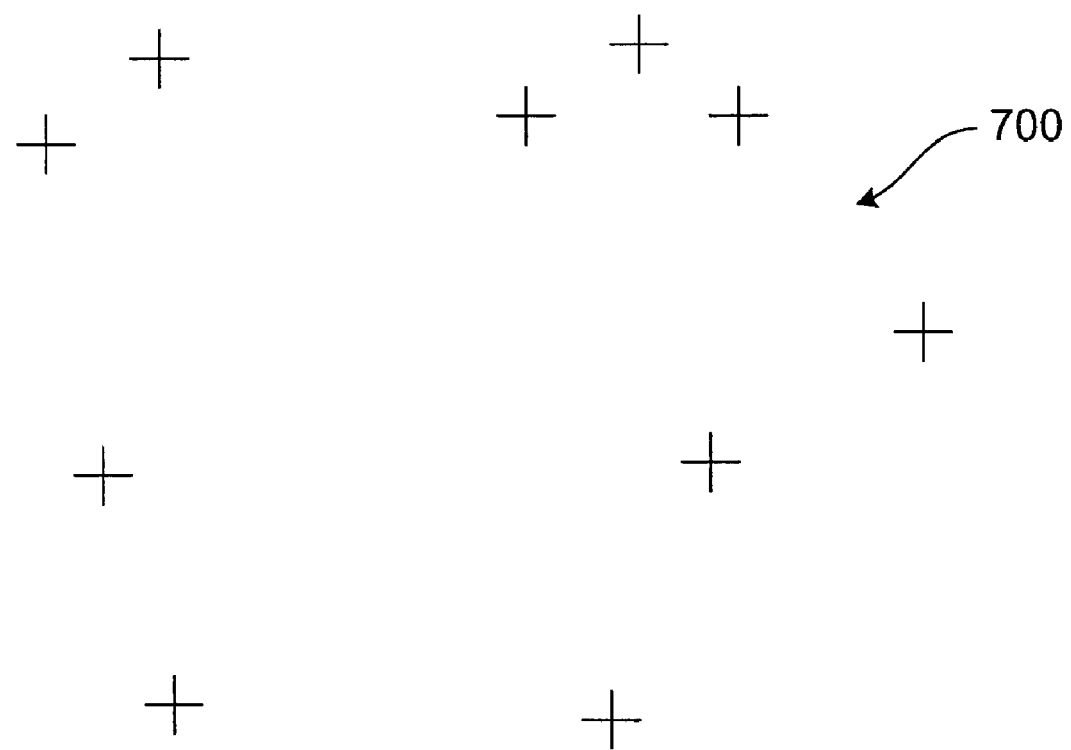
FIGS. 7B-7H are representations of anchor points, balloons and leader lines and illustrate a process of attaching anchor points to balloons in a rectangular around placement configuration.

Referring to FIG. 7A, an example of an assembly drawing 760 is shown including balloons 701 arranged about a rectangle (not shown) enclosing a region 702 that includes a set of anchor points 703 associated with the components of the assembly drawing 760. The balloons 701 are attached to the anchor points 703 by leaders 704. The arrangement of the balloons 701 around four sides of the assembly drawing 700 can be referred to as "rectangular around placement" configuration.

Figure 7C:
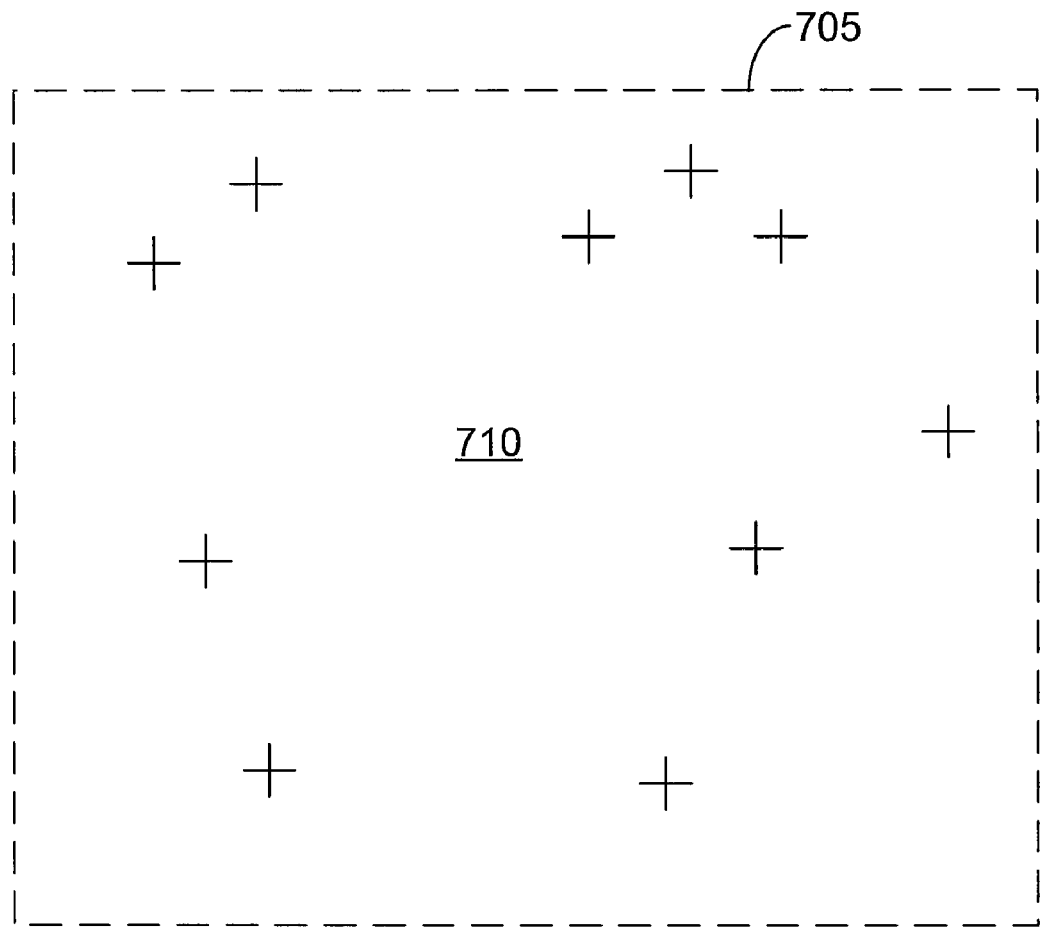
Figure 7D:
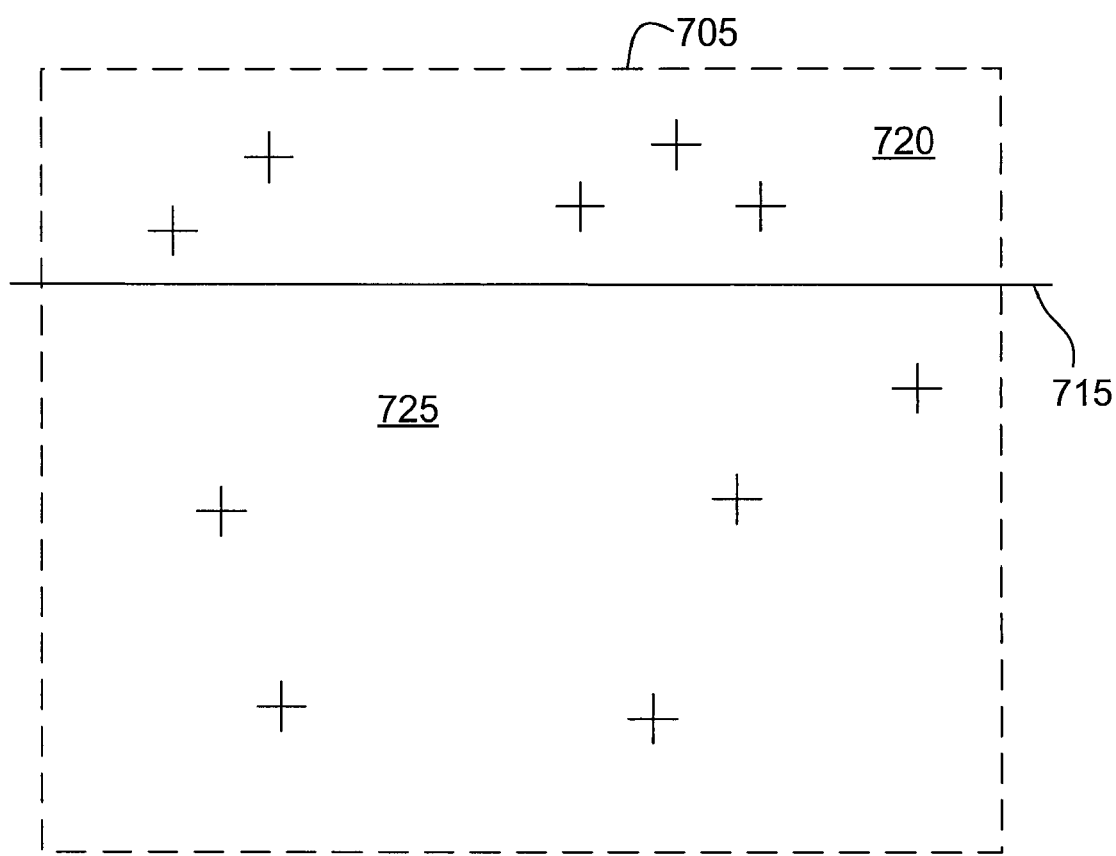
Figure 7E:
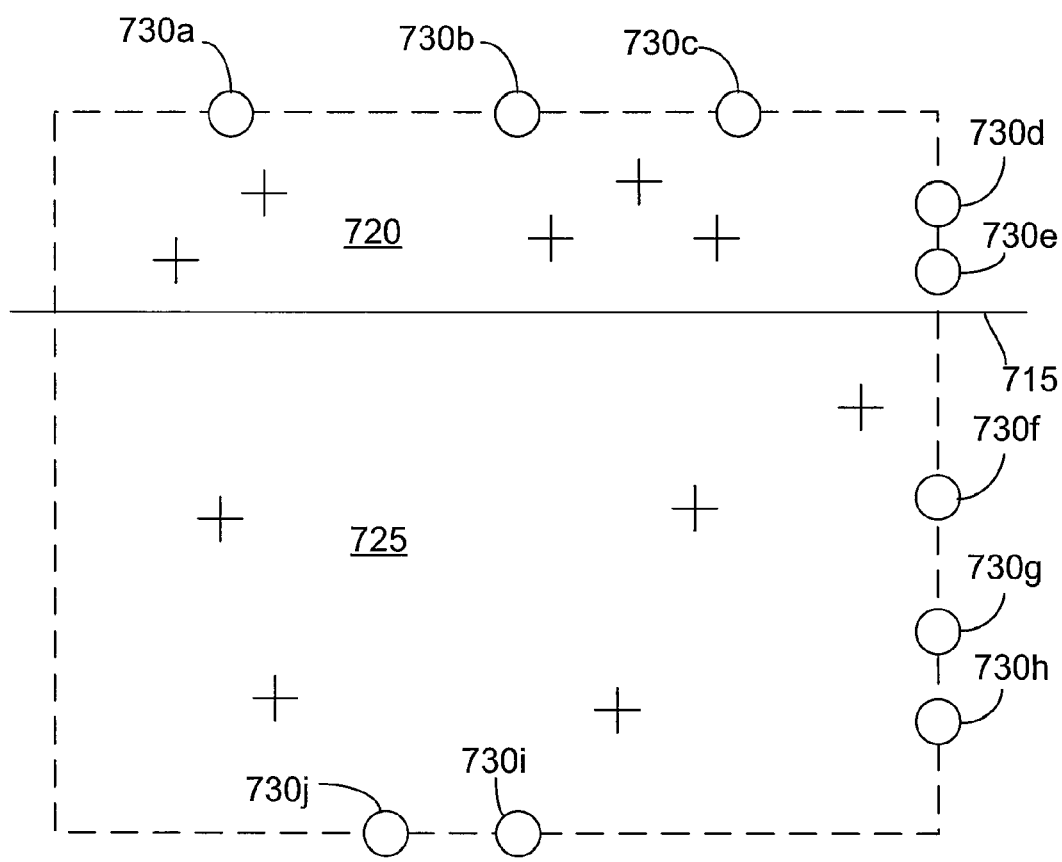
Figure 7F:
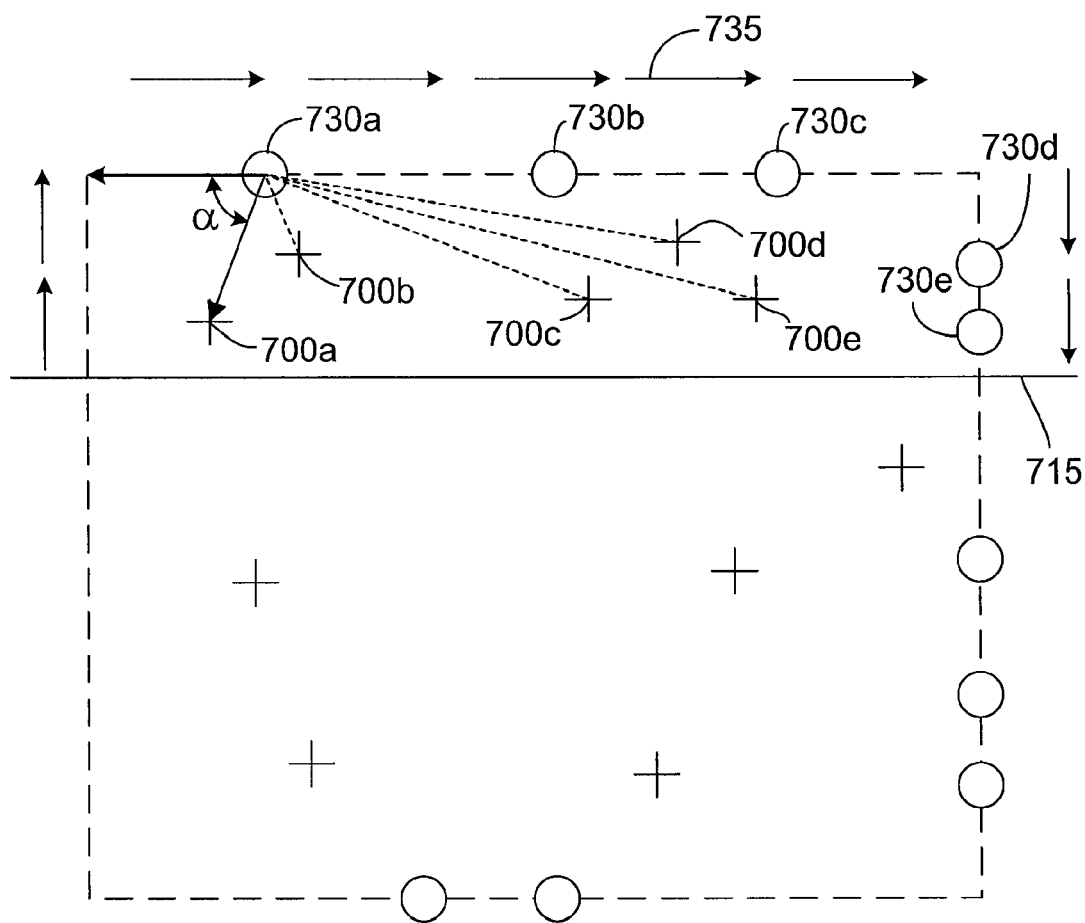
Figure 7G:
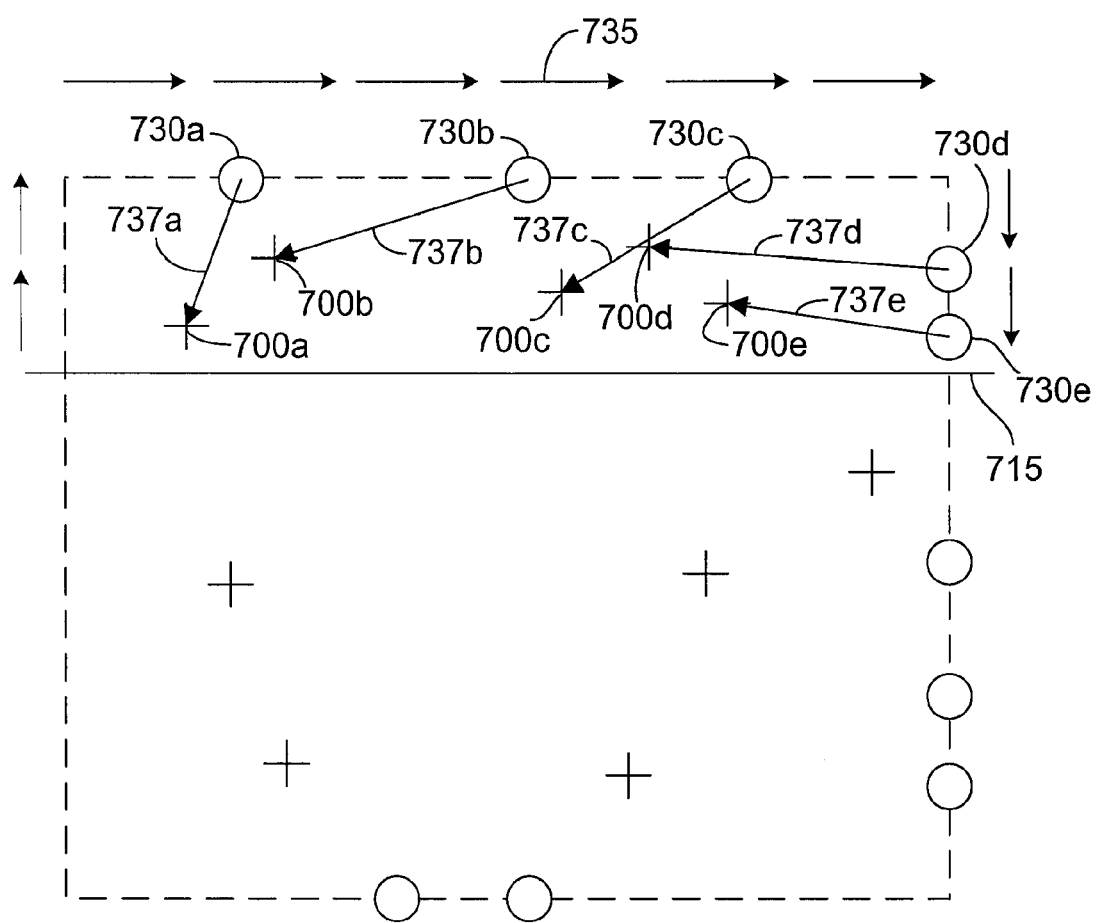
Figure 7H:
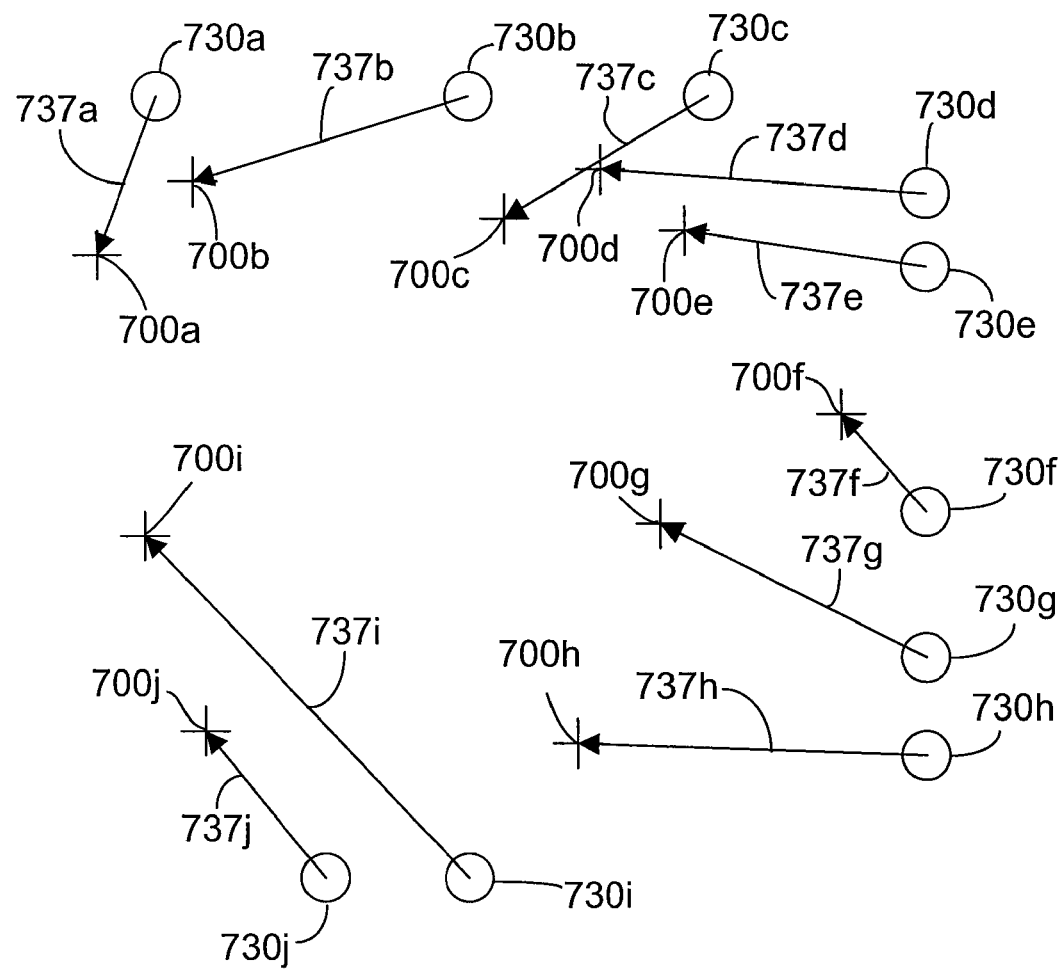
Figure 8A:
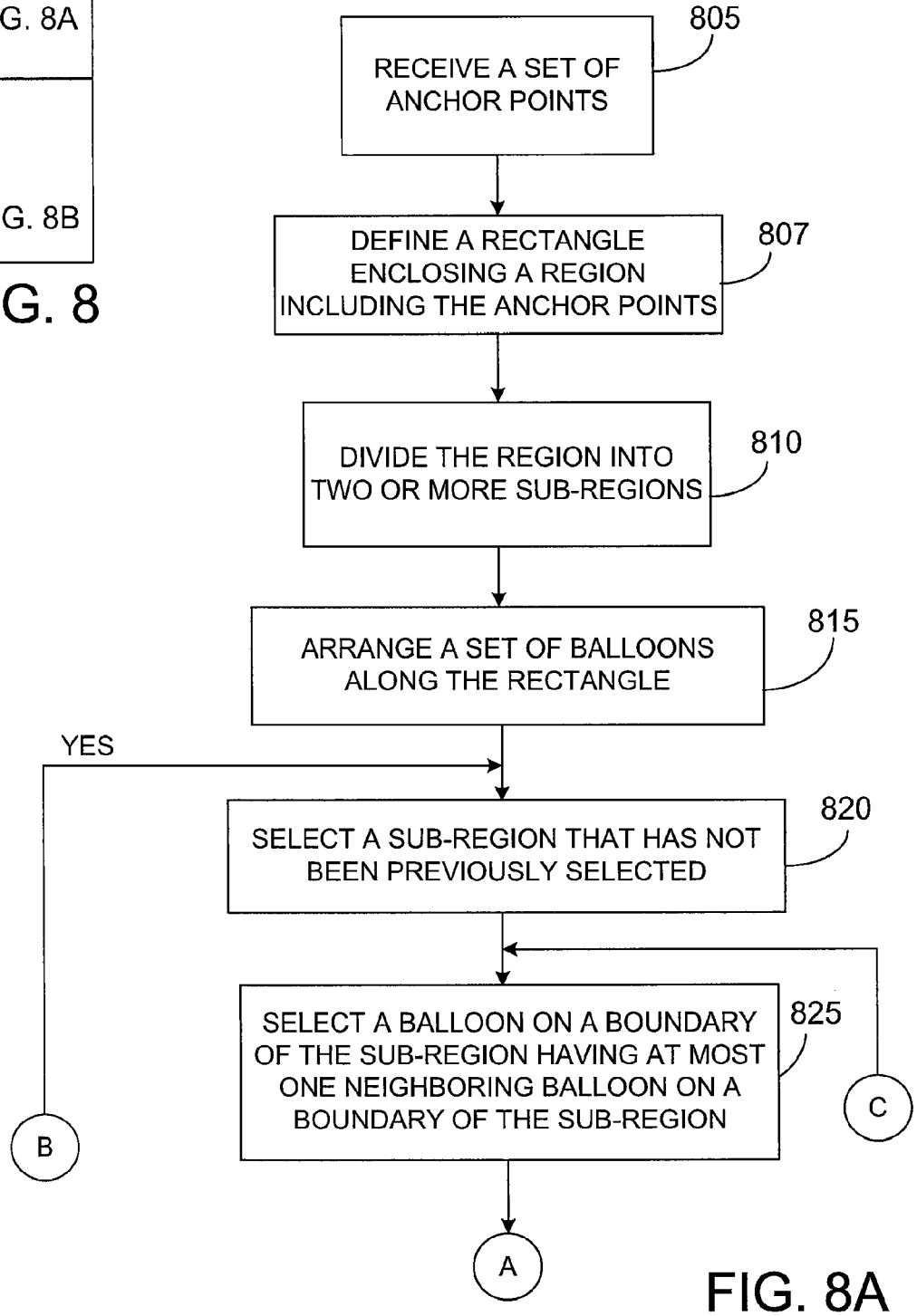
FIG. 8 is a flowchart showing a process for attaching balloons arranged along a rectangle enclosing a region including anchor points of an assembly drawing.
Figure 8B:
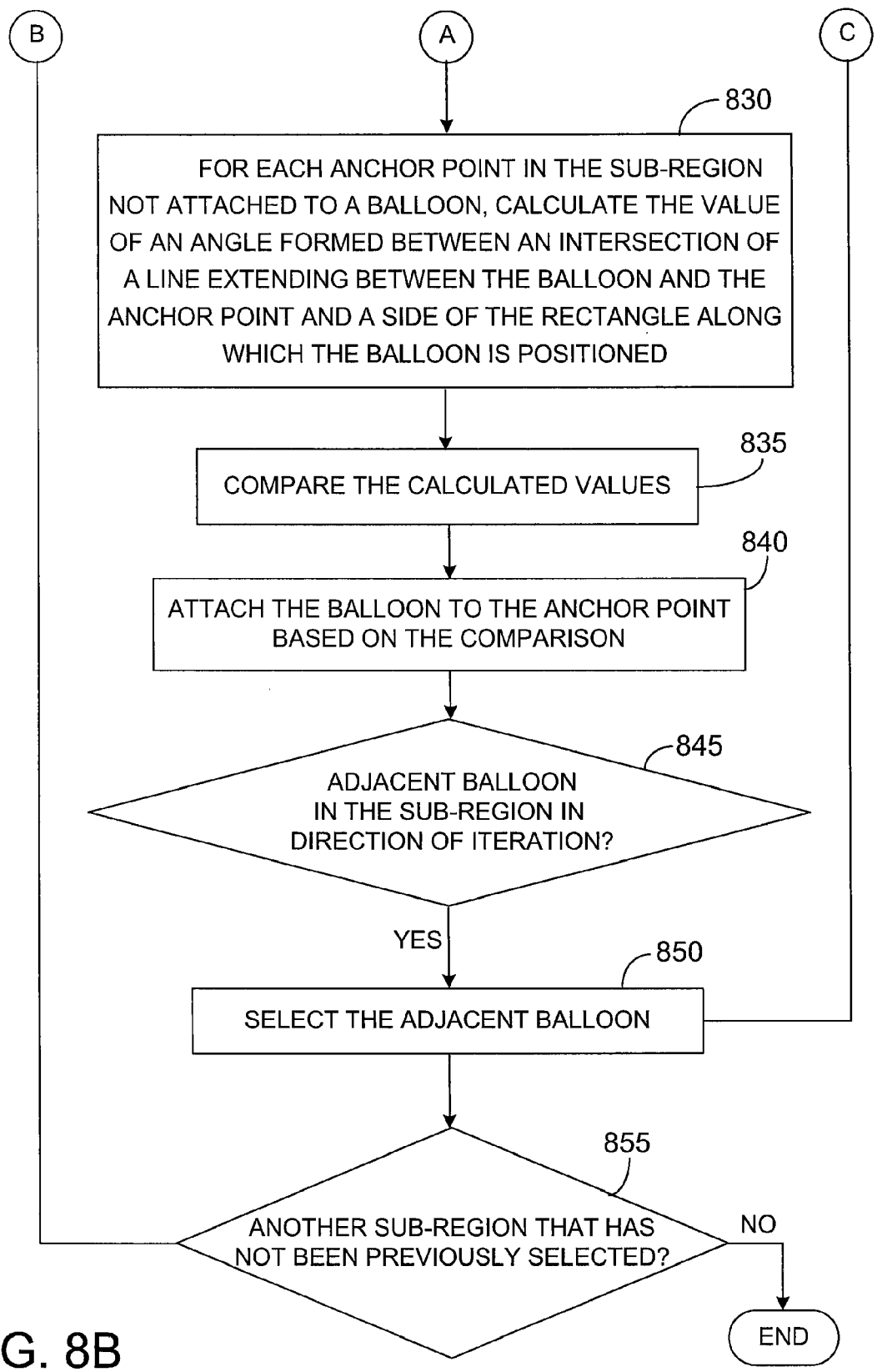

FIG. 8 is a flowchart showing a process 800 for attaching a set of anchor points to a set of balloons in a rectangular around placement configuration (i.e., balloons placed around four sides of the assembly drawing in a rectangular configuration). Referring to FIGS. 7B-H, for illustrative purposes, a set of balloons will be connected to a set of anchor points 700 shown in FIG. 7B, according to the process 800. The set of anchor points 700 is received (step 805). Referring to FIG. 7C, the anchor points 700 are included in a region 710 enclosed by a rectangle 705. The rectangle 705 is defined, i.e., the size and configuration selected (step 807), for example, the rectangle can be defined as a design choice by the designer. In one implementation, the rectangle 705 is defined such that the entire assembly drawing associated with the anchor points 700 can be included within the rectangle, as well as a predetermined margin around the perimeter of the assembly drawing.

The region 710 that includes the anchor points 700 is divided into at least two sub-regions (step 810). With respect to each sub-region, a portion of at least one side of the rectangle is included in a boundary of the sub-region. In one implementation, no more than portions of three sides of the rectangle 705 are included in the boundary of the sub-region. For example, referring to FIG. 7D, the region 710 is divided into two sub-regions 720 and 725 by a substantially horizontal line 715. In this example, the boundaries of the sub-regions 720, 725 are selected so that each sub-region includes an equal amount of the anchor points 700. The boundary of each sub-region includes portions of three sides of the rectangle 705. In another implementation, the boundaries of the sub-regions can be selected such that each sub-region has an equal area. Other criteria can be used to select the boundaries of the sub-regions, so long as with respect to each sub-region, a portion of at least one side of the rectangle is included in a boundary of the sub-region, and no more than portions of three sides of the rectangle 705 are included in the boundary of the sub-region. In another implementation, the rectangle 705 can be divided into more than two sub-regions.

Referring to FIG. 7E, a set of balloons 730 is arranged along the rectangle 705, such that an amount of balloons along the boundary of each sub-region is at least equal to an amount of anchor points 700 included in the sub-region (step 815). Typically, the amount of balloons 730 is equal to the amount of anchor points 700, although a designer may choose to have an unequal number for a design reason. In the present example, the amount of balloons 730 along the boundary of each sub-region 720, 725 equals the number of anchor points 700 included within the corresponding sub-region 720, 725.

A sub-region is selected as a sub-region to which to attach the anchor points 700 included therein to the balloons 730 arranged along the boundary of the sub-region (step 820). In the present example, the upper sub-region 720 is selected as a first sub-region of in which to attach the anchor points 700 to the balloons 730.

In the selected sub-region 720, a balloon 730 that has at most one neighboring balloon on the boundary of the sub-region 720 is selected as a first balloon to connect to an anchor point (step 825). In the present example, either balloon 730a or 730e can be chosen; for illustrative purposes balloon 730a is selected. Selecting a balloon 730 with at most one neighboring balloon also selects the direction of iteration as either clockwise or counterclockwise, depending on the direction of the one neighboring balloon. In the present example, the one neighboring balloon 703b is in a clockwise direction from the selected first balloon 730a, and the direction of iteration 735 for the sub-region 720 is therefore clockwise.

An angle can be formed by an intersection of a line extending between the balloon 730a and each anchor point 700 included in the sub-region 720, and the side of the rectangle 705 along which the balloon 730 is positioned. A number of possible angles can be calculated as described above in reference to FIG. 2E. The same type of angle is calculated with respect to each anchor point 700 in the sub-region 720, and the angles compared to one another. The decision as to which anchor point 700 to attach to the balloon 730a is based on the comparison. For example, in one implementation, the non-reflex angle is calculated that is formed between: (1) a segment connecting the balloon 730a to each anchor point 700 in the sub-region 720, e.g., anchor point 700a; and (2) a ray that extends from the balloon 730a along a substantially straight line that is collinear with the side of the rectangle 705 upon which the balloon 730a is positioned and in a direction opposite to the direction of iteration 735. Referring to FIG. 7F, for each anchor point 700a-e included in the sub-region 720 that is not already attached to a balloon 730, such a non-reflex angle is calculated (step 830). The angles are compared (step 835), and the balloon 730a is attached to an anchor point 700 based on the comparison (step 840). In this implementation, the non-reflex angles are compared to determine the smallest angle, and the balloon 730a is attached to the anchor point 700 corresponding to the smallest angle, which in the present example is anchor point 700a. In one implementation, the comparison of the non-reflex angles to determine the smallest angle can be according to the process 400 shown in FIG. 4, described above, although other processes can be used.

A check is performed to determine whether there is an adjacent balloon 730 in the direction of iteration 735 (step 845). If there is an adjacent balloon 730, such as balloon 730b in the present example ("Yes" branch of decision step 845), then the adjacent balloon 730b is selected (step 850) and steps 830 to 840 are repeated for the balloon 730b. The process continues until there are no more adjacent balloons 730 in the direction of iteration 735 in the selected sub-region 720. Referring to FIG. 7G, the balloons 730a-e are shown attached to the anchor points 700a-e included in the sub-region 720 by leaders 737a-e. No two leaders 737 intersect. Only one iteration through the balloons 730a-e was performed.

Referring again to FIG. 8, a check is made to determine whether there remain sub-regions that have not been previously selected (step 855). If there is such a sub-region, for example, sub-region 725 in the present example ("Yes" branch of decision step 855), then a next previously unselected sub-region is selected, i.e., sub-region 725, (step 820) and steps 820 through 850 are repeated for the sub-region 725. If there are no such sub-regions ("No" branch of decision step 855), then the automatic ballooning process 800 ends.

Performance of the steps 820 through 850 for the lower sub-region 725 is substantially the same as for the upper sub-region 720 already described. The direction of iteration for the lower sub-region 725 can be either clockwise or counterclockwise, depending on which balloon 730 is selected as the first balloon, and does not have to be in the same direction as for the upper sub-region 720.

Referring to FIG. 7H, the balloons 703a-j are shown attached to the anchor points 700a-j by leaders 737a-j.

Figure 9A:
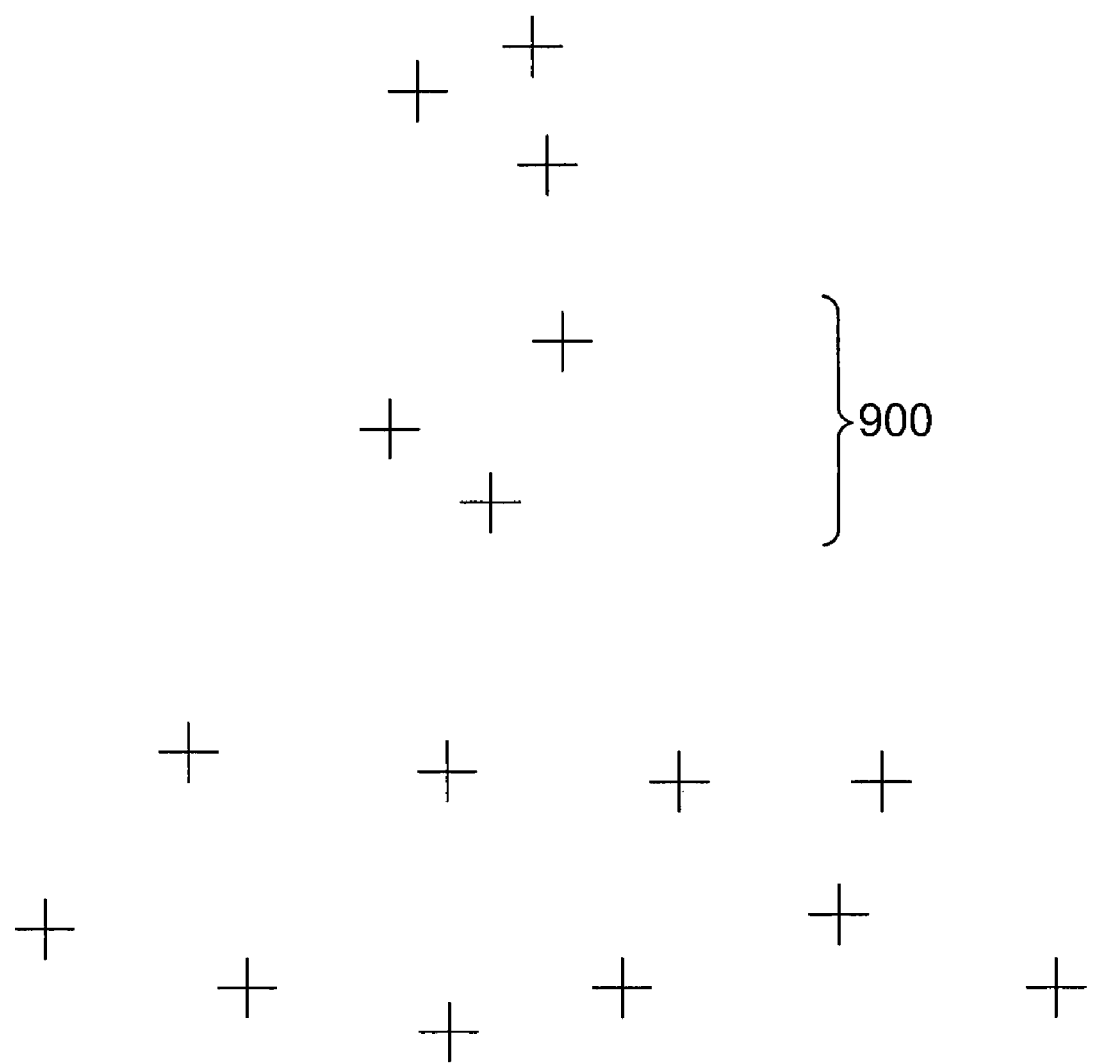
FIGS. 9A-D are representations of anchor points, balloons and leaders and illustrate a process of attaching anchor points to balloons.
Figure 9B:
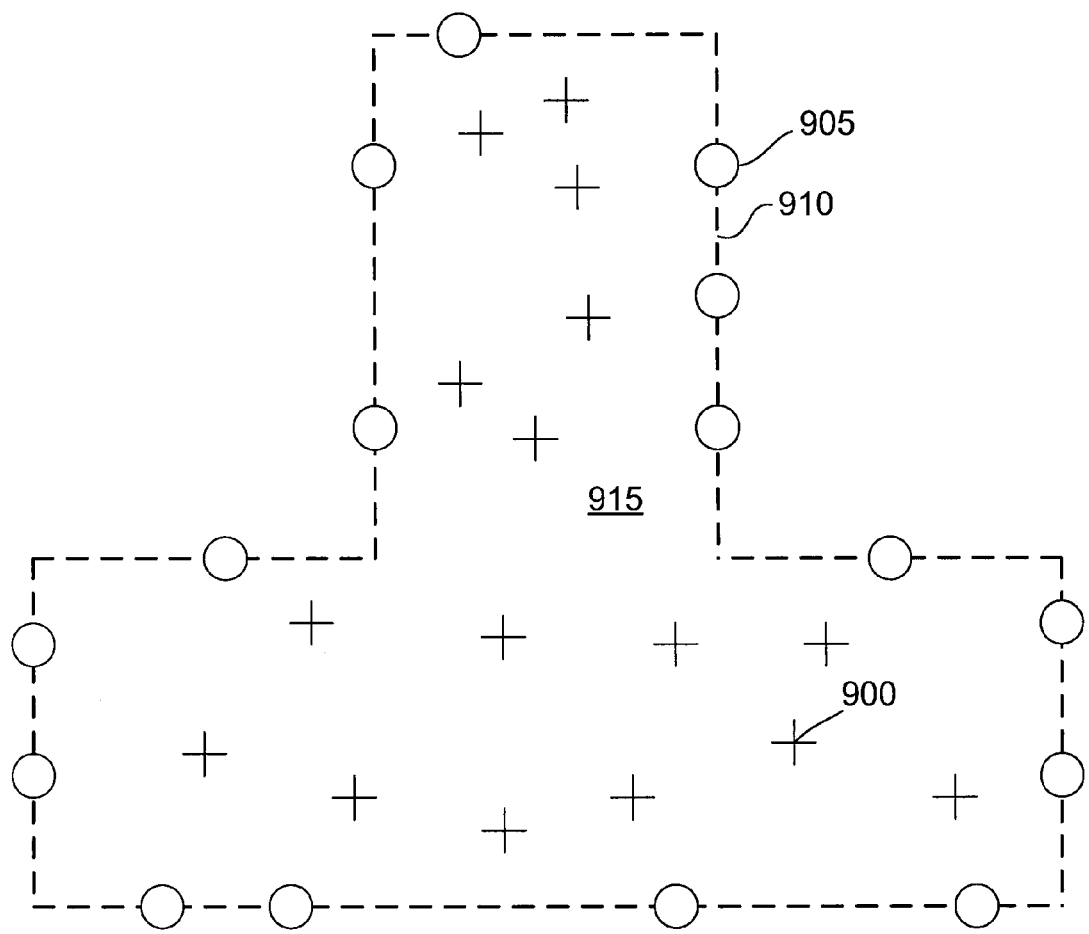
Figure 9C:
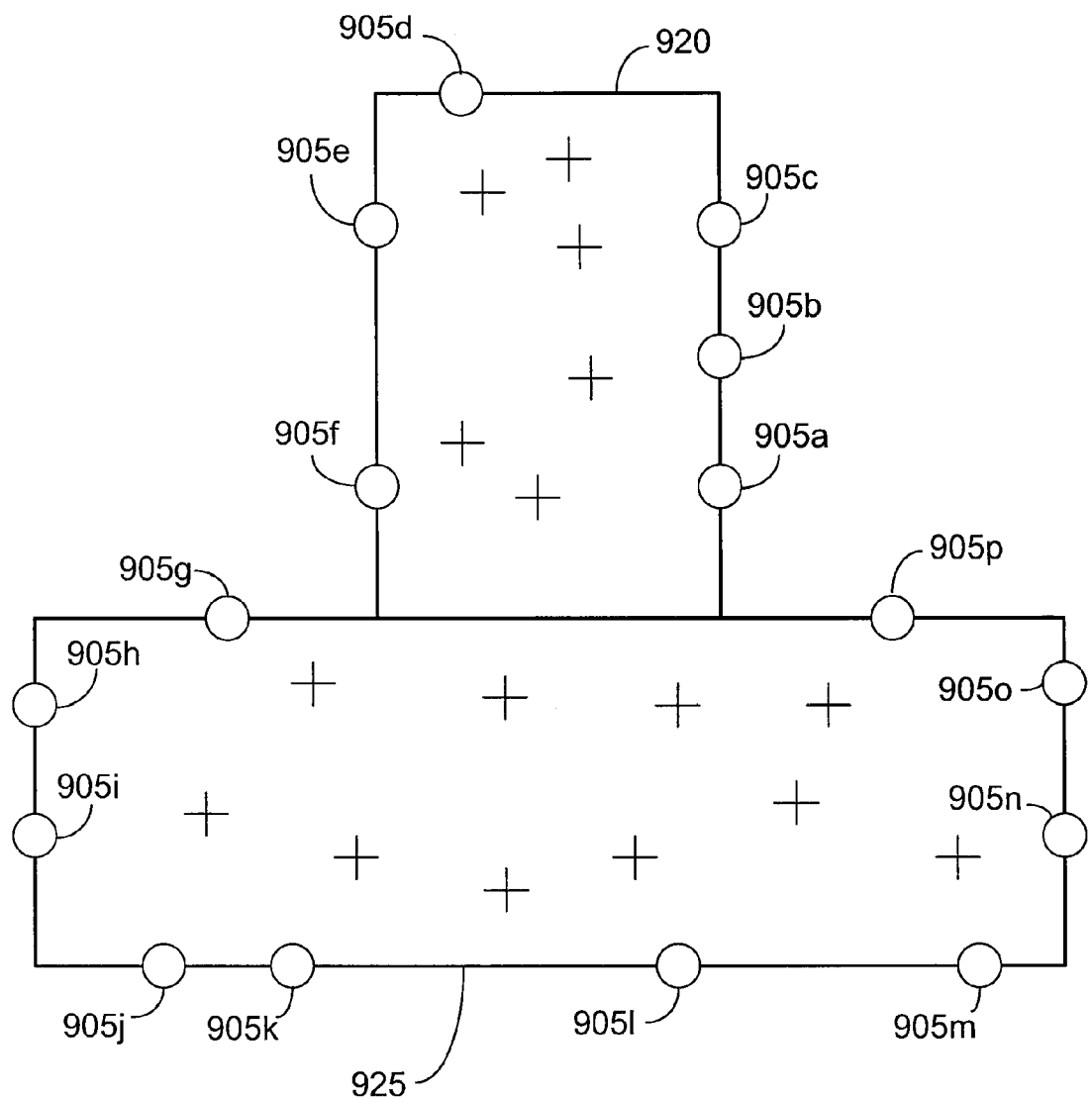

In another implementation, automatic ballooning is possible when the balloons are arranged along a polygon that encloses a region including a set of anchor points, which polygon can be divided into two or more rectangles. For example, referring to FIG. 9A, a set of anchor points 900 is shown. FIG. 9B shows a possible arrangement of balloons 905 along a polygon 910 enclosing a region 915 including the set of anchor points 900. As shown in FIG. 9C, the polygon 910 can be divided into two rectangles 920 and 925. Each rectangle 920, 925 including balloons arranged on all four sides can be treated separately during automatic ballooning according to the process 800 described above in reference to FIG. 8. The balloons 905g-p positioned along the lower rectangle 925 can be attached to the anchor points 900g-p enclosed by the rectangle 925 as per the process 800. That is, the lower rectangle 925 will be divided into sub-regions and the anchor points in the sub-regions attached to corresponding balloons, as described above in reference to FIGS. 7A-H.

Partial Rectangular Around Placement

With respect to the upper rectangle 920, since the balloons 905a-f are positioned along only three sides of the rectangle 920, a simplified process for "partial rectangular around placement" can be used. That is, the process 800 described above in reference to FIG. 8 for a rectangular around placement configuration can be simplified for partial rectangular around placement configurations, i.e., configurations where a set of balloons is positioned along only two or three sides of the rectangle. In a partial rectangular around placement configuration, the step 810 of dividing the region into two or more sub-regions can be eliminated, and the entire region can be treated as consisting of one sub-region having a boundary of two or three sides for the balance of the process 800.

Therefore, since the balloons 905a-f in FIG. 9C are positioned along only three sides of the upper rectangle 920, automatic ballooning is possible without dividing the upper rectangle 920 into two or more sub-regions (step 810), and the entire upper rectangle 920 can be treated as one sub-region in steps 825-850 of the ballooning process 800, as modified for partial rectangular around placement configuration. For example, balloon 905a—a balloon 905 that has at most one neighboring balloon on the boundary of the three-sided "sub-region" (i.e., upper rectangle 920)—can be selected as a first balloon to connect to an anchor point (step 825), and the corresponding direction of iteration for the upper rectangle 920 can be counterclockwise. Balloons 905a-f can be attached to anchor points within the upper rectangle 920 according to steps 830-850.

Figure 9D:
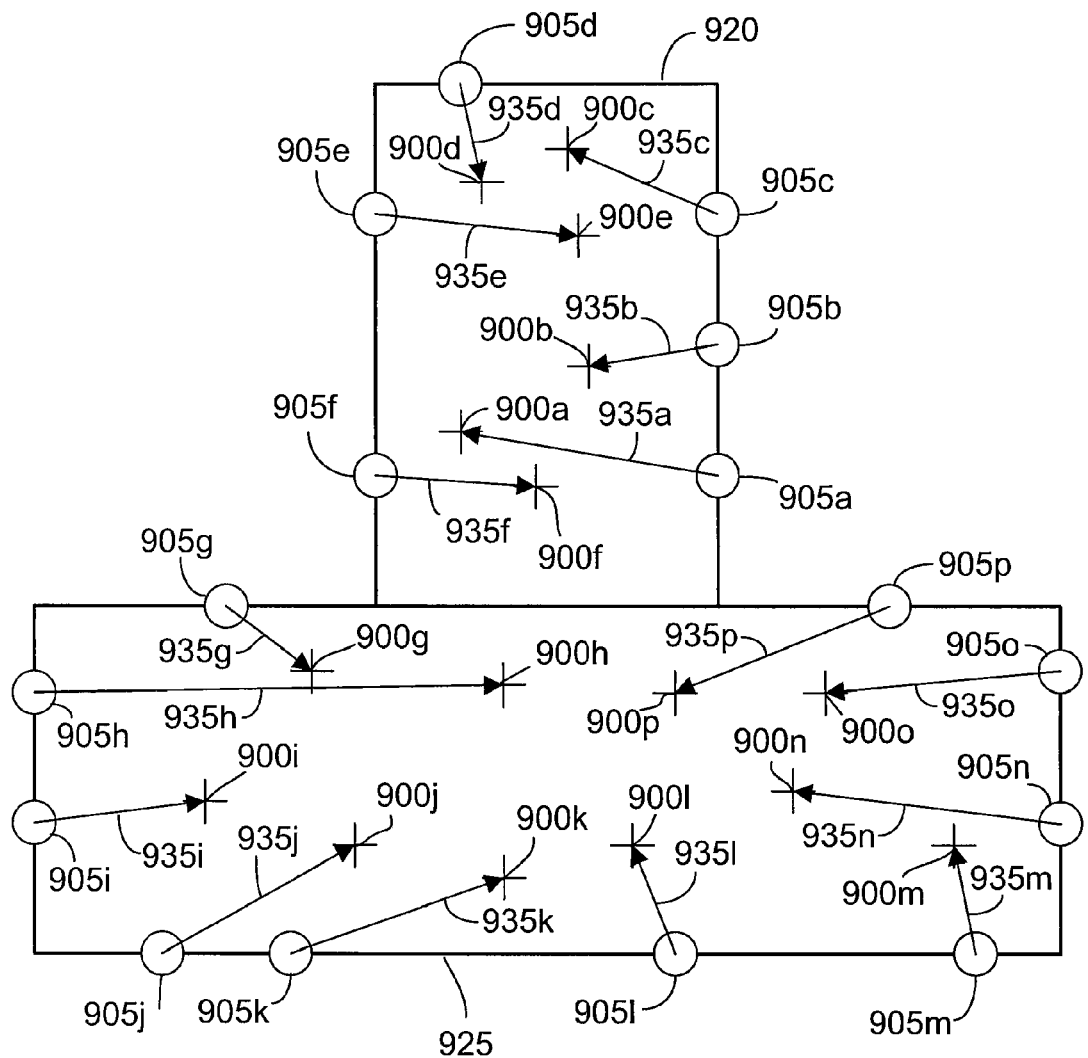

FIG. 9D shows the balloons 905a-p attached to the anchor points 900a-p by leaders 935.

The steps above for attaching balloons to anchor points in a partial around placement configuration can also be used when the balloons are arranged along two or more lines that intersect at angles other than right angles (i.e., then the rectangle or partial rectangle configuration). Preferably the balloons are arranged along lines that intersect at angles greater than or equal to 90° and less than 180°, to avoid conflicting leaders.

Polygonal Around Placement

The around placement configurations discussed above referred to balloons placed along a rectangle enclosing a region including a set of anchor points, which can be an aesthetically pleasing configuration. However, other configurations are possible, including balloons placed along polygons having shapes other than rectangles, and where the anchor points are either within a region enclosed by the polygon, only partially within the region or entirely outside the region. In one implementation, the shape of the balloon-placement polygon can be user defined, a pre-set default, or calculated in accordance with an outline of an assembly drawing to be ballooned, e.g., the smallest possible polygon enclosing the assembly drawing. Using the techniques for attaching balloons to anchor points described above in reference to anchor points positioned along either a single substantially straight line or along 2 or 3 lines, balloons arranged along the side of polygons also can be attached to anchor points.

In one implementation, if the balloons are placed along a polygon enclosing a region including the entire set of anchor points, then the region is divided into two or more sub-regions, where each sub-region:

a. has a boundary including at least a portion of a side of the polygon; and b. if the boundary includes portions of two or more sides of the polygon, the sides do not intersect at an angle of less than 90° or greater than 180°.

As mentioned above, if the boundary includes portions of two or more sides, although the sides may intersect at an angles of less than 90°, for improved reliability in terms of non-intersecting leaders, angles between 90° and 180° can be used.

In another implementation, if the balloons are placed along a polygon enclosed a region including the entire set of anchor points, then the region is divided into two or more sub-regions, where each sub-region has a boundary including at least a portion of only one side of the polygon. In this implementation, the leaders are guaranteed not to cross after a single iteration through the balloons, and no conflict checking for crossed leaders is required.

Balloons can be positioned along the sides of the polygon, based on the division of the region into sub-regions, i.e., such that the number of balloons positioned along the boundary of a sub-region at least equals the number of anchor points within the sub-region, and the balloons attached to the anchor points using techniques described above.

If the balloons are placed along a polygon enclosing a region that includes some or none of the anchor points, i.e., some or all of the anchor points are on the outside of the balloon-placement polygon, then an outer-polygon can be defined that encloses a region including all of the anchor points and the balloon-placement polygon. In another implementation, the region enclosed by the outer-polygon can be divided into two or more sub-regions, such that each sub-region includes at least a portion of only one side of the balloon-placement polygon. In this implementation, the leaders are guaranteed not to cross after a single iteration through the balloons, and no conflict checking for crossed leaders is required.

Figure 10:
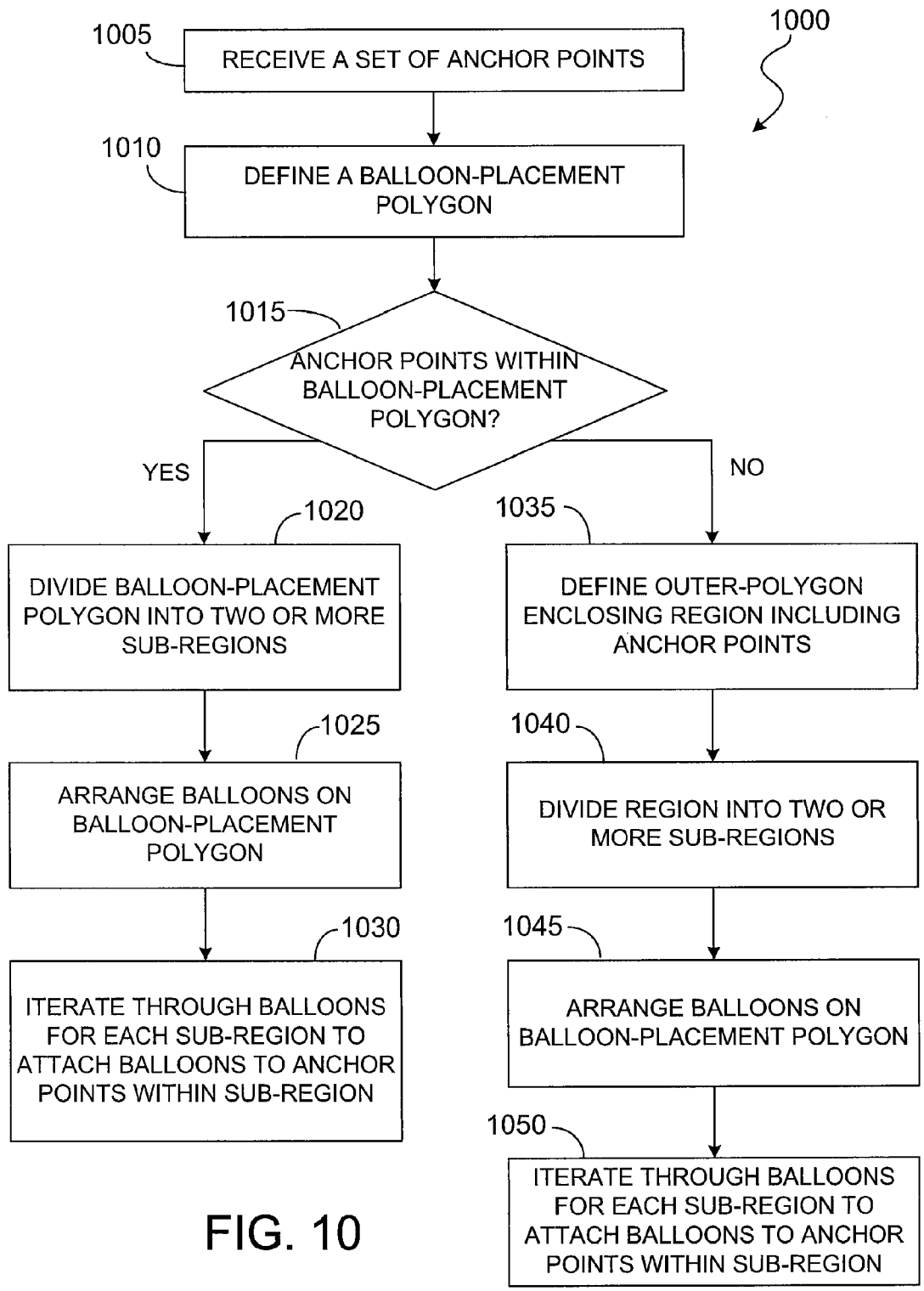
FIG. 10 is a flowchart showing a process for attaching balloons arranged about the perimeter of an assembly drawing to anchor points.

Referring to FIG. 10, a flowchart is shown illustrating a process 1000 for attaching balloons to anchor points, where the balloons are to be positioned along a balloon-placement polygon enclosing a region that either includes all, some or none of a set of anchor points to be attached to the balloons.

Figure 11A:
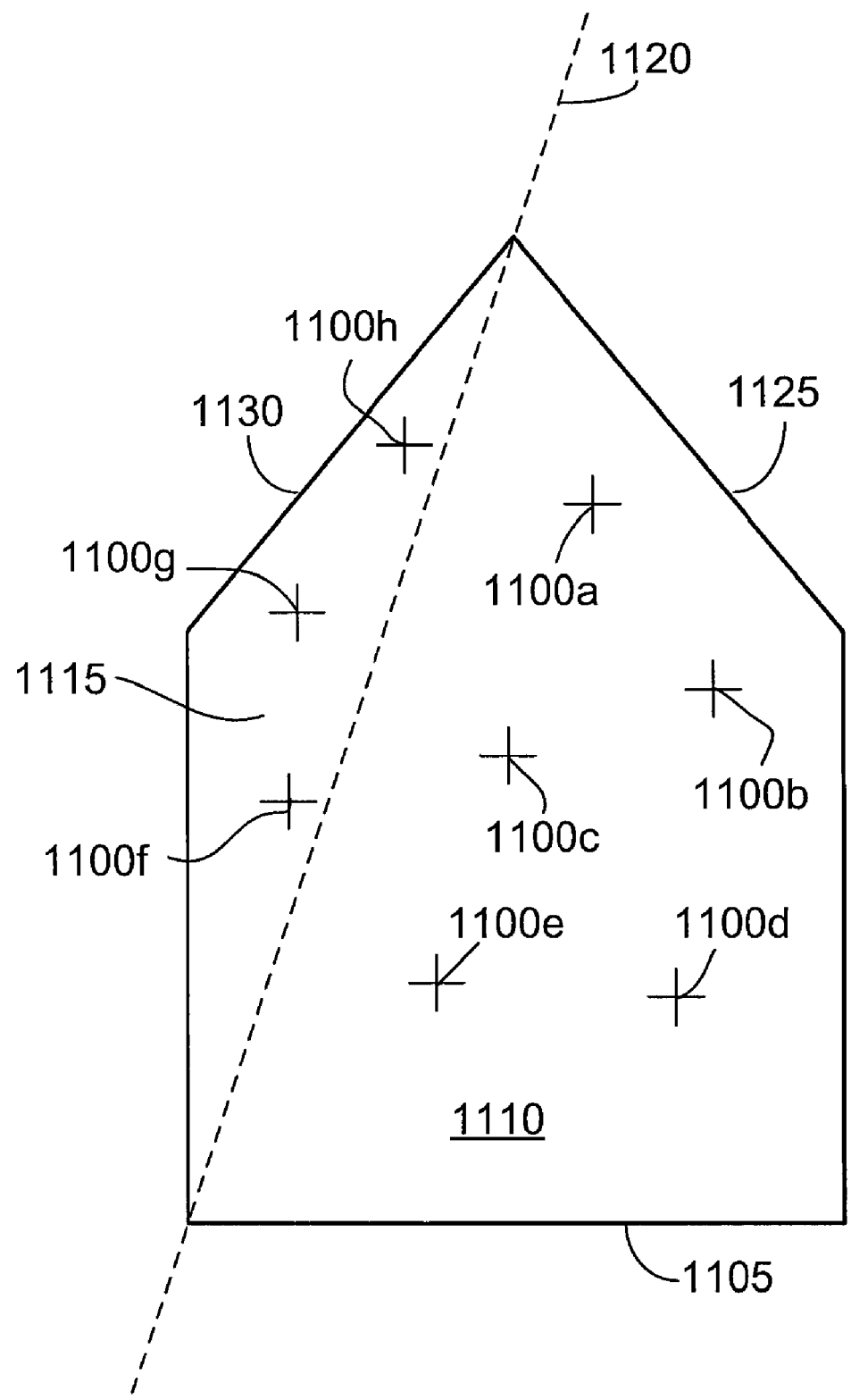
FIGS. 11A-C are representations of anchor points, balloons and leaders and illustrate a process of attaching anchor points to balloons that are arranged along a polygon enclosing a region including all anchor points.
Figure 11B:
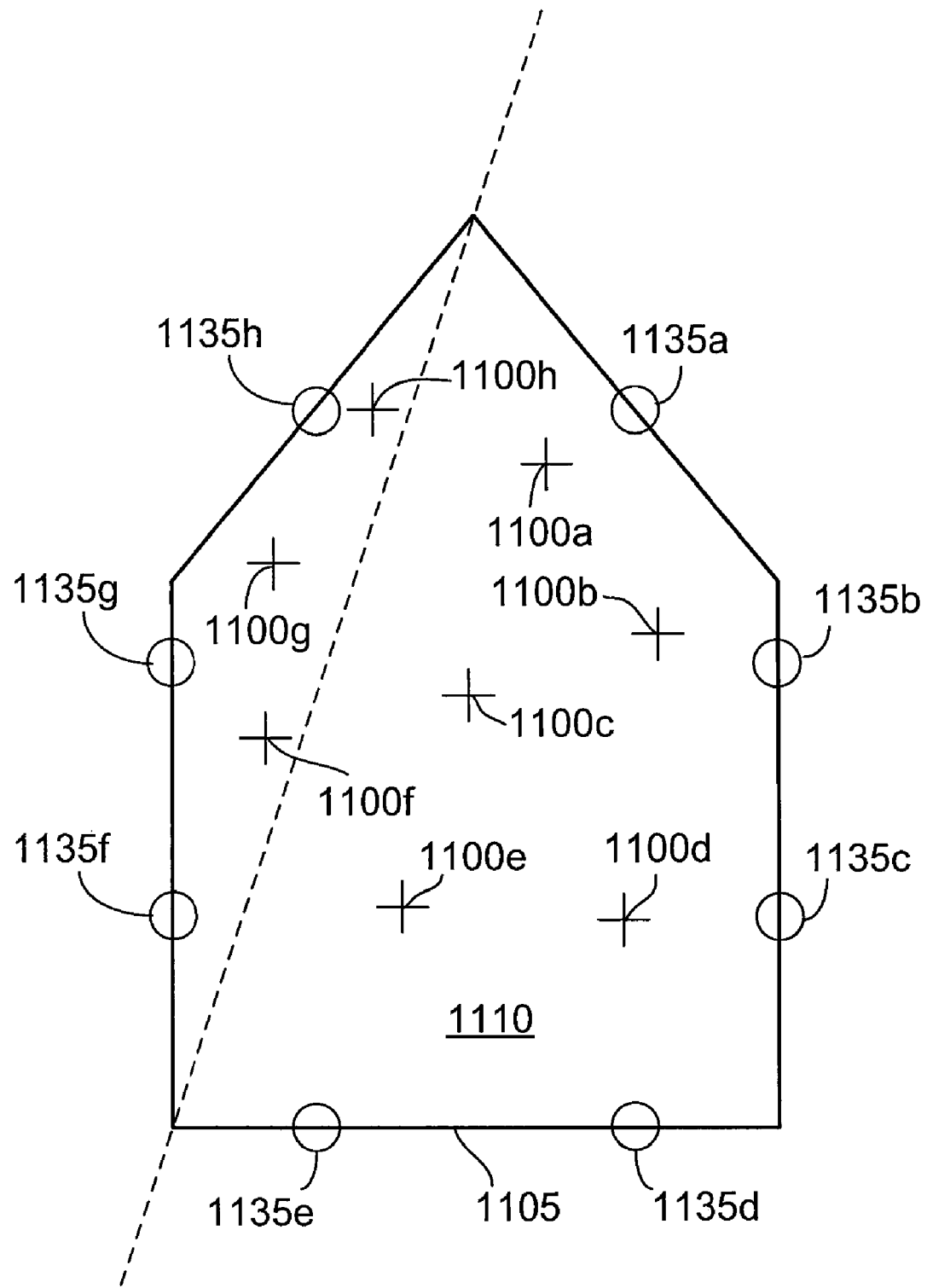
Figure 11C:
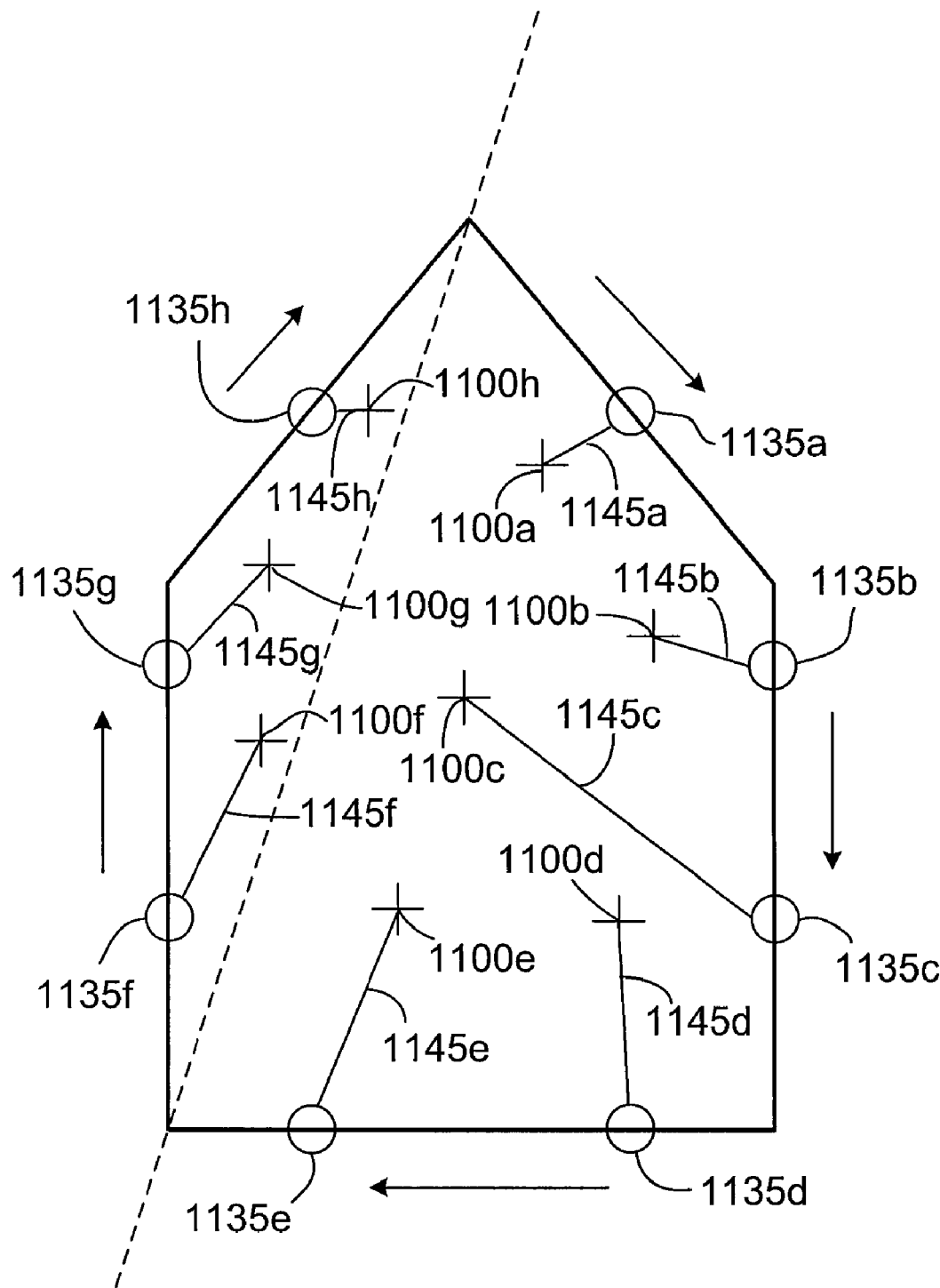

Referring to FIGS. 11A-C, for illustrative purposes, a set of balloons will be connected to a set of anchor points, wherein all anchor points are enclosed within a balloon-placement polygon according to process 1000. Referring to FIG. 11A, a set of anchor points 1100 is received (step 1005). A balloon-placement polygon 1105 is defined, i.e. the size and configuration selected (step 1010). Since all anchor points in the set of anchor points 1100 are within the balloon-placement polygon 1105 ("Yes" branch of decision step 1015), the balloon-placement polygon is divided into two or more sub-regions. In the present example, the balloon-placement polygon 1105 is divided into two sub-regions 1110 and 1115 by a line 1120 (step 1020). The two sub-regions 1110, 1115 are selected such that each sub-region has a boundary including at least a portion of a side of the balloon-placement polygon 1105 and no two sides of the balloon-placement polygon 1105 intersect at an angle of less than 90° or greater than 180° in any sub-region. As such, neither sub-region 1110, 1115 includes the two sides 1125, 1130 of the balloon-placement polygon 1105 that meet at an acute angle.

Referring to FIG. 11B, a set of balloons 1135 is arranged on the balloon-placement polygon, such that an amount of balloons along the boundary of each sub-region is at least equal to an amount of anchor points 1100 included in the sub-region (step 1025). Typically, the amount of balloons 1135 is equal to the amount of anchor points 1100, although a designer may choose to have an unequal number for design reasons. In the present example, the amount of balloons 1135 along the boundary of each sub-region 1110, 1115 equals the number of anchor points 1100 included within the corresponding sub-region 1110, 1115.

In each sub-region 1110, 115, the balloons 1135 are iterated through and attached to anchor points 1100 within the respective sub-region 1110, 1115 (step 1030). The balloons 1135 in a given sub-region are iterated through in a clockwise or counterclockwise direction of iteration, with a first balloon selected in a sub-region being a balloon with at most one neighboring balloon along the boundary of the sub-region. The balloons 1135 can be attached to anchor points 1100 in the sub-region according to the angled balloon placement method described above. Referring to FIG. 11C, in the present example, balloons 1135 in each region 1110, 1115 are iterated through in clockwise direction 1140, wherein a first balloon selected in sub-region 1110 is 1135$f$ and a first balloon 1135 selected in sub-region 1110 is 1135$a$.

FIG. 11C shows the balloons 1135$a$-$h$ attached to the anchor points 1100$a$-$h$ by leaders 1145. In other implementations, the balloon-placement polygon 1105 can be divided into more than two sub-regions. Alternatively, the balloon-placement polygon 1105 can be divided into sub-regions such that the boundary of each sub-region includes at most one side of the balloon-placement polygon 1105, in order to guarantee the leaders attaching the balloons 1135 to the anchor points 1100 will not intersect after a single iteration through the balloons 1135.

Figure 12A:
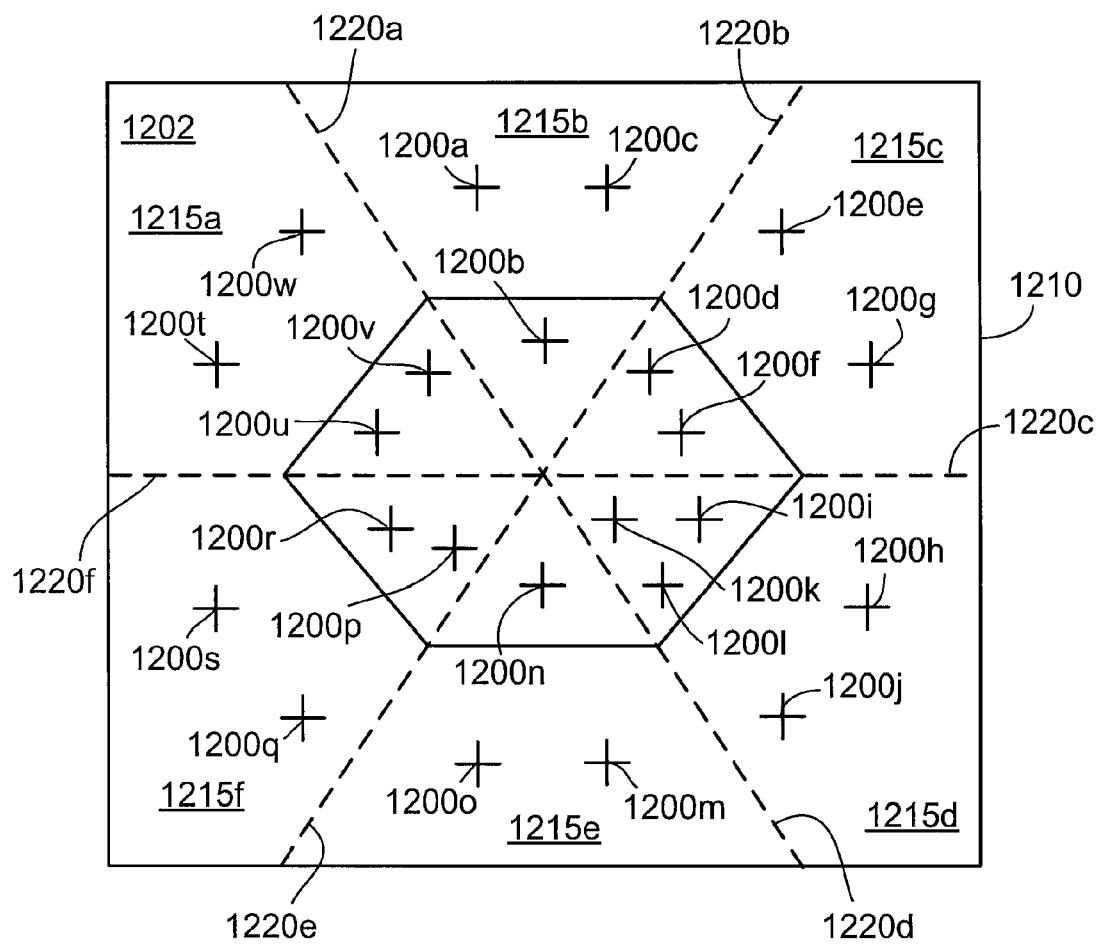
FIGS. 12A-D are representations of anchor points, balloons and leaders and illustrate a process of attaching anchor points to balloons that are arranged along a polygon.

Referring to FIGS. 12A-D, for illustrative purposes, a set of balloons will be connected to a set of anchor points, wherein not all anchor points are enclosed within a balloon-placement polygon, according to the process 1000. Referring to FIG. 12A, a set of anchor points 1200 is received (step 1005), and a balloon-placement polygon 1205 is defined, i.e., the size and configuration selected (step 1010). Since not all anchor points in the set of anchor points 1200 are within the balloon-placement polygon 1205 ("No" branch of decision step 1015), an outer-polygon 1210 is defined that encloses a region 1202 including all anchor points 1200 and the balloon-placement polygon 1205 (step 1035).

Referring to FIG. 12A, the region 1202 including the anchor points 1200 is divided into six sub-regions 1215$a$-$f$ by lines 1220$a$-$f$ (step 1040). Sub-regions 1215$a$-$f$ are selected such that each sub-region includes at least a portion of one side of the balloon-placement polygon 1205. Because only one side of the balloon-placement polygon 1205 is included in each sub-region, there will be no conflicting leaders after a single iteration through the balloons 1235, and no necessity for conflict checking for conflicting leaders.

Figure 12B:
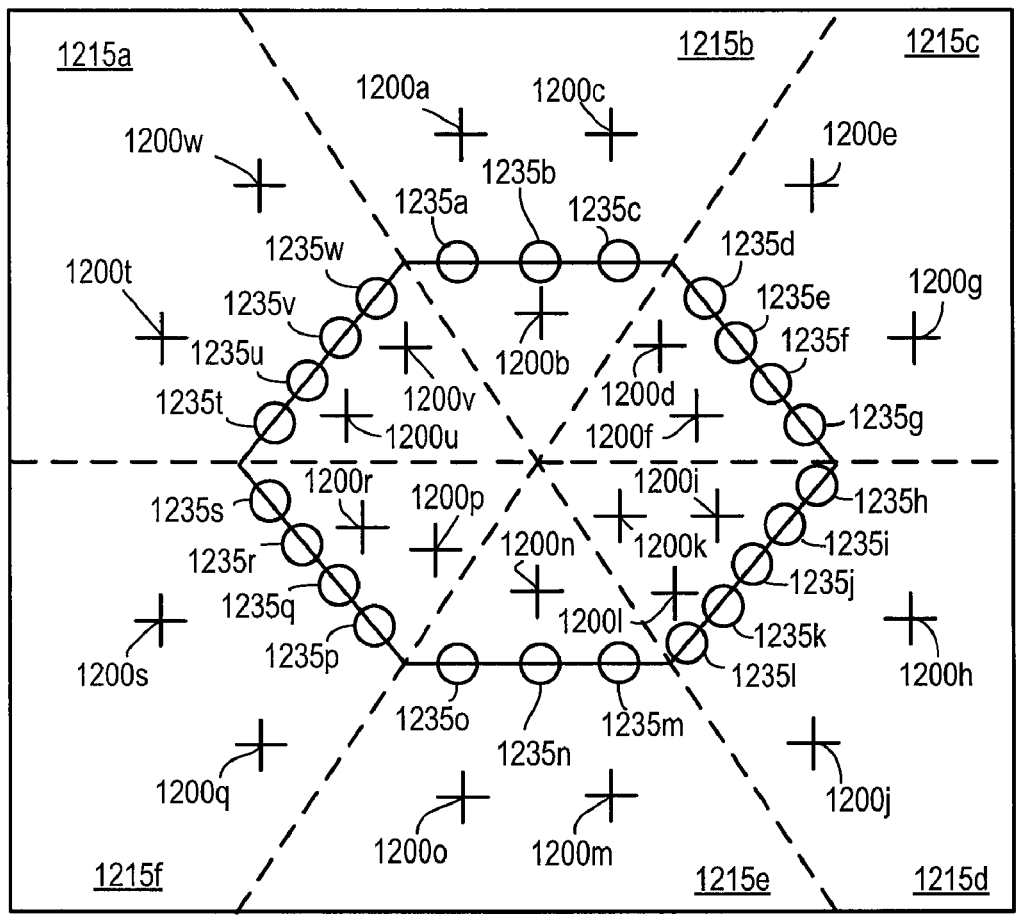

Referring to FIG. 12B, a set of balloons 1235 is arranged on the balloon-placement polygon, such that an amount of balloons along the boundary of each sub-region is at least equal to an amount of anchor points 1200 included in the sub-region (step 1045). Typically, the amount of balloons 1235 is equal to the amount of anchor points 1200, although a designer may choose to have an unequal number for design reasons. In the present example, the amount of balloons 1235 along the boundary of each sub-region 1215$a$-$f$ equals the number of anchor points 1200 included within the corresponding sub-region 1215$a$-$f$.

Figure 12C:
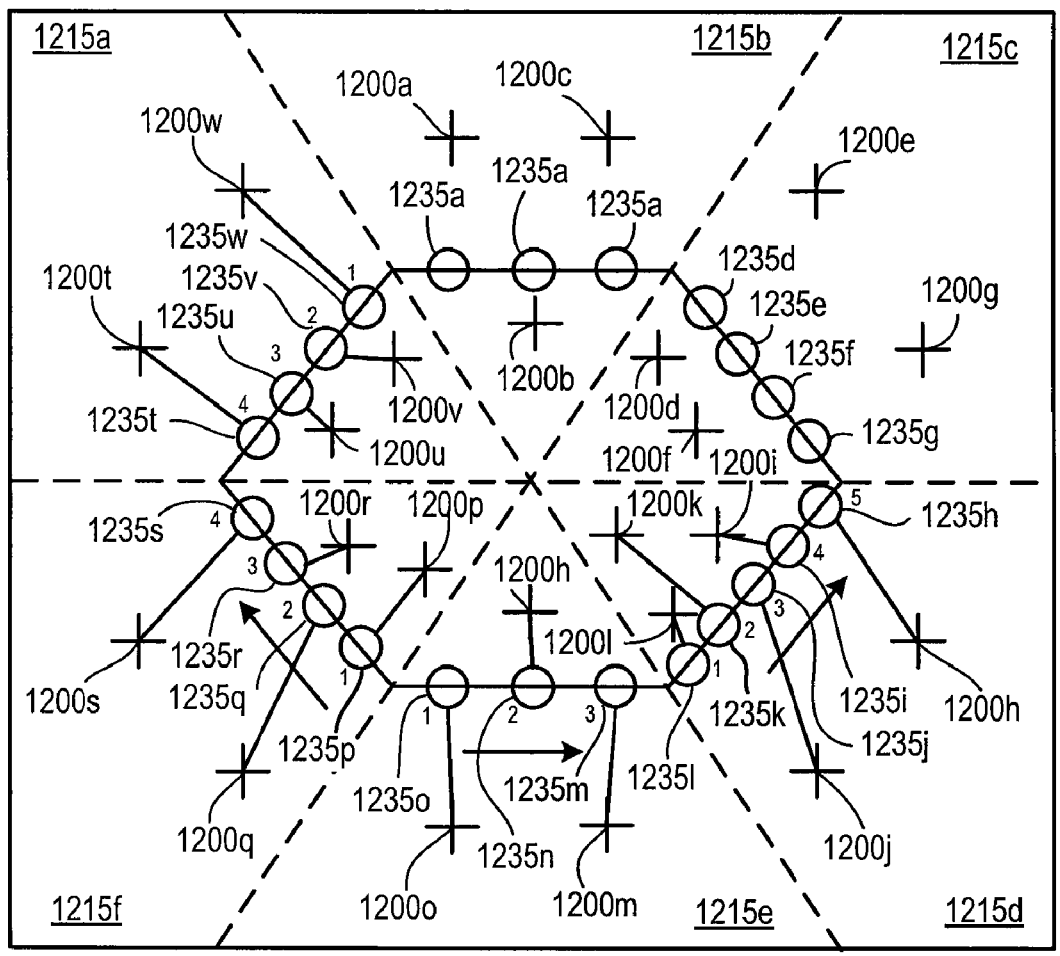

In each sub-region 1215$a$-$f$, the balloons 1235 are iterated through and attached to anchor points 1200 within the respective sub-region 1215$a$-$f$ (step 1050). The balloons 1235 in a given region are iterated through in a clockwise or counterclockwise direction of iteration, with a first balloon selected in the given region being a balloon 1235 with at most one neighboring balloon in the given sub-region. The balloons 1235 can be attached to the anchor points in the sub-region according to the angled balloon placement method described above, which can be used when anchor points are positioned on either or both sides of the angled line (in this case, a side of the balloon-placement polygon 1205). Referring to FIG. 12C, in the present example, balloons 1235*p-s* in sub-region 1215*f* are iterated through in a clockwise direction 1225, wherein a first balloon selected in sub-region 1215*f* is 1235*p*. Balloons 1235*h-l* in sub-region 1215*d* are iterated through in a counter-clockwise direction 1230, wherein a first balloon selected in sub-region 1215*d* is 1235*l*.

Figure 12D:
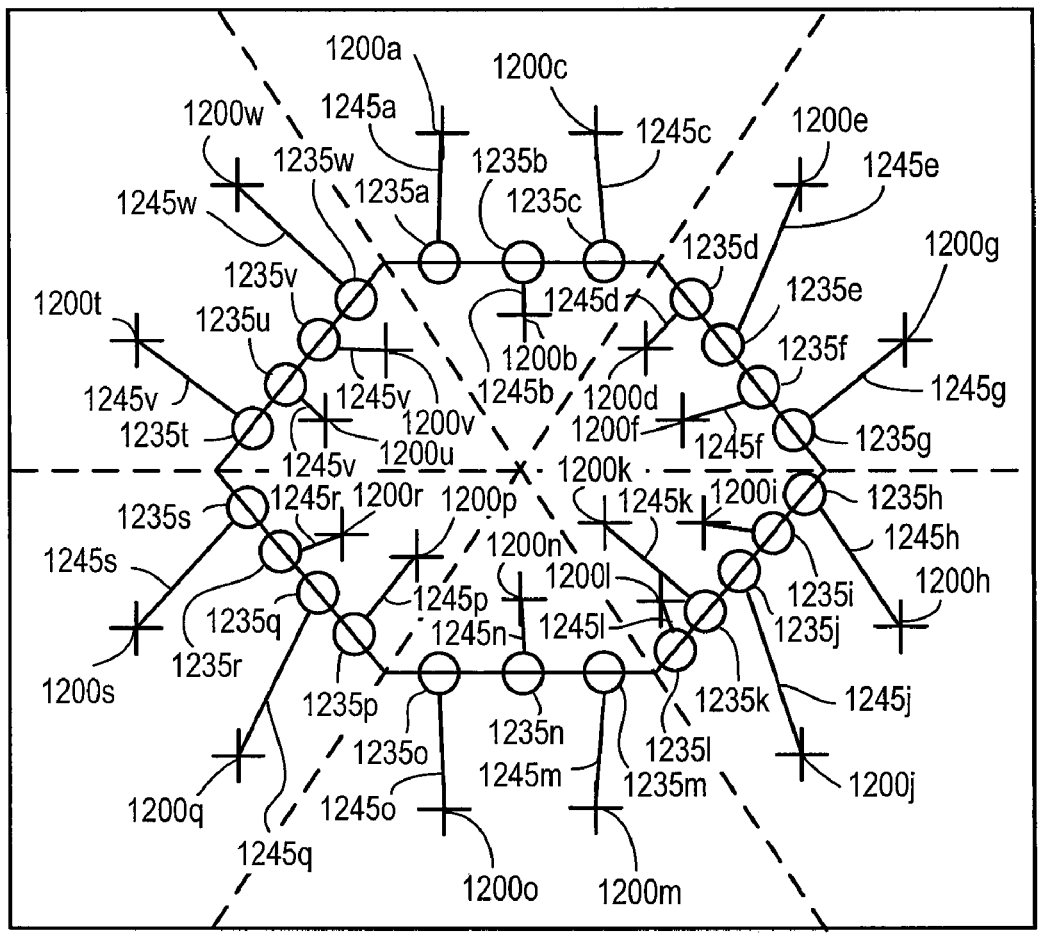

FIG. 12D shows the balloons 1235*a-w* attached to the anchor points 1200*a-w* by leaders 1145. No two leaders 1145 intersect. Only one iteration through the balloons 1235*a-w* was performed; there was no necessity for conflict checking of leaders, and therefore no necessity to adjust balloon positioning or balloon-anchor point pairings to avoid conflicts.

The invention and all of the functional operations described in this specification can be implemented in digital electronic circuitry, or in computer hardware, firmware, software, or in combinations of them. Apparatus of the invention can be implemented in a computer program product tangibly embodied in a machine-readable storage device for execution by a programmable processor; and method steps of the invention can be performed by a programmable processor executing a program of instructions to perform functions of the invention by operating on input data and generating output.

The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language.

Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; a magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

To provide for interaction with a user, the invention can be implemented on a computer system having a display device such as a monitor or LCD screen for displaying information to the user and a keyboard and a pointing device such as a mouse or a trackball by which the user can provide input to the computer system. The computer system can be programmed to provide a graphical user interface through which computer programs interact with users.

A number of embodiment of the invention have been described. Nevertheless, it will be understood that various modifications may be made without departing from the spirit and scope of the invention. The logic flows depicted in FIGS. 3, 4, 8 and 10 do not require the particular order shown, or sequential order, to achieve desirous results, and the steps of the invention can be performed in a different order and still achieve desirous results. Accordingly, other embodiments are within the scope of the following claims.

What is claimed is:

1. A method for attaching balloons to anchor points. comprising:
  performing the following operations using a computing device:
  receiving a set of balloons arranged along a substantially straight line:
  receiving a set of anchors points positioned on either or both sides of the substantially straight line:
  iterating through the balloons in the set of balloons, selecting an outermost balloon for a first iteration and progressively selecting a next adjacent balloon for each successive iteration until all balloons in the set of balloons have been iterated through. and for each balloon:
  iterating through the anchor points that are not already attached to a balloon by a leader, and for each such anchor point calculating a value of an angle formed by an intersection of a line extending between the balloon and the anchor point and the substantially straight line:
  comparing the calculated values for each such anchor point: and attaching the balloon to an anchor point using a leader based on the comparison of the calculated values:
  wherein upon completion of one iteration through the balloons no two leaders intersect, and wherein:
  calculating the value of an angle comprises calculating a non-reflex angle formed between a segment connecting the balloon to the anchor point and a ray that originates at the balloon and extends along the straight line in a direction away from a second outermost balloon situated on the substantially straight line;
  comparing the calculated values for each such anchor point comprises determining the smallest non-reflex angle; and
  attaching the balloon to an anchor point based on the comparison of the calculated values comprises attaching the balloon to an anchor point corresponding to the smallest non-reflex angle.

2. A method for attaching balloons to anchor points, comprising:
  performing the following operations using a computing device:
  receiving a set of balloons arranged along a substantially straight line:
  receiving a set of anchors points positioned on either or both sides of the substantially straight line:
  iterating through the balloons in the set of balloons. selecting an outermost balloon for a first iteration and progressively selecting a next adjacent balloon for each successive iteration until all balloons in the set of balloons have been iterated through. and for each balloon:
  iterating through the anchor points that are not already attached to a balloon by a leader, and for each such anchor point calculating a value of an angle formed by an intersection of a line extending between the balloon and the anchor point and the substantially straight line:
  comparing the calculated values for each such anchor point: and attaching the balloon to an anchor point using a leader based on the comparison of the calculated values:
  wherein upon completion of one iteration through the balloons no two leaders intersect, and wherein:
  calculating the value of an angle comprises calculating a reflex angle formed between a segment connecting the balloon to the anchor point and a ray that originates at the balloon and extends along the straight line in a direction away from a second outermost balloon situated on the substantially straight line;

comparing the calculated values for each such anchor point comprises determining the largest reflex angle; and attaching the balloon to an anchor point based on the comparison of the calculated values comprises attaching the balloon to an anchor point corresponding to the largest reflex angle.

3. A method for attaching balloons to anchor points, comprising:

performing the following operations using a computing device:

receiving a set of balloons arranged along a substantially straight line:

receiving a set of anchors points positioned on either or both sides of the substantially straight line:

iterating through the balloons in the set of balloons, selecting an outermost balloon for a first iteration and progressively selecting a next adjacent balloon for each successive iteration until all balloons in the set of balloons have been iterated through, and for each balloon:

iterating through the anchor points that are not already attached to a balloon by a leader, and for each such anchor point calculating a value of an angle formed by an intersection of a line extending between the balloon and the anchor point and the substantially straight line:

comparing the calculated values for each such anchor point: and attaching the balloon to an anchor point using a leader based on the comparison of the calculated values:

wherein upon completion of one iteration through the balloons no two leaders intersect, and wherein:

calculating the value of an angle comprises calculating a non-reflex angle formed between a segment connecting the balloon to the anchor point and a ray that originates at the balloon and extends along the straight line in a direction toward a second outermost balloon situated on the substantially straight line;

comparing the calculated values for each such anchor point comprises determining the largest non-reflex angle; and attaching the balloon to an anchor point based on the comparison of the calculated values comprises attaching the balloon to an anchor point corresponding to the largest non-reflex angle.

4. method for attaching balloons to anchor points, comprising:

performing the following operations using a computing device:

receiving a set of balloons arranged along a substantially straight line:

receiving a set of anchors points positioned on either or both sides of the substantially straight line:

iterating through the balloons in the set of balloons, selecting an outermost balloon for a first iteration and progressively selecting a next adjacent balloon for each successive iteration until all balloons in the set of balloons have been iterated through, and for each balloon:

iterating through the anchor points that are not already attached to a balloon by a leader, and for each such anchor point calculating a value of an angle formed by an intersection of a line extending between the balloon and the anchor point and the substantially straight line:

comparing the calculated values for each such anchor point; and attaching the balloon to an anchor point using a leader based on the comparison of the calculated values;

wherein upon completion of one iteration through the balloons no two leaders intersect, and wherein:

calculating the value of an angle comprises calculating a reflex angle formed between a segment connecting the balloon to the anchor point and a ray that originates at the balloon and extends along the straight line in a direction toward a second outermost balloon situated on the substantially straight line;

comparing the calculated values for each such anchor point comprises determining the smallest reflex angle; and attaching the balloon to an anchor point based on the comparison of the calculated values comprises attaching the balloon to an anchor point corresponding to the smallest reflex angle.

5. The method of claim 1, 2, 3, or 4, wherein the substantially straight line is a substantially horizontal line.

6. The method of claim 1, 2, 3, or 4, wherein the substantially straight line is a substantially vertical line.

7. The method of claim 1, 2, 3, or 4, wherein there are an equal number of balloons and anchor points and upon completion of one iteration each balloon in the set of balloons is attached to one anchor point in the set of anchor points by a leader.

8. A computer program product, tangibly stored on a computer-readable medium, for attaching balloons to anchor points, comprising:

instructions operable to cause a programmable processor to:

receive a set of balloons arranged along a substantially straight line;

receive a set of anchors points positioned on either or both sides of the substantially straight line:

iterate through the balloons, in the set of balloons, selecting an outermost balloon for a first iteration and progressively selecting a next adjacent balloon for each successive iteration until all balloons in the set of balloons have been iterated through, and for each balloon:

iterate through the anchor points that are not already attached to a balloon by a leader, and for each such anchor point calculating a value of an angle formed by an intersection of a line extending between the balloon and the anchor point and the substantially straight line;

compare the calculated values for each such anchor point; and attach the balloon to an anchor point using a leader based on the comparison of the calculated values;

wherein upon completion of one iteration through the balloons no two leaders intersect, and wherein:

instructions operable to calculate the value of an angle comprise instructions operable to calculate a non-reflex angle formed between a segment connecting the balloon to the anchor point and a ray that originates at the balloon and extends along the straight line in a direction away from a second outermost balloon situated on the substantially straight line;

instructions operable to compare the calculated values for each such anchor point comprise instructions operable to determine the smallest non-reflex angle; and instructions operable to attach the balloon to an anchor point based on the comparison of the calculated values comprise instructions operable to attach the balloon to an anchor point corresponding to the smallest non-reflex angle.

9. A computer program product, tangibly stored on a computer-readable medium, for attaching balloons to anchor points, comprising:
instructions operable to cause a programmable processor to:
receive a set of balloons arranged along a substantially straight line;
receive a set of anchors points positioned on either or both sides of the substantially straight line;
iterate through the balloons in the set of balloons. selecting an outermost balloon for a first iteration and progressively selecting a next adjacent balloon for each successive iteration until all balloons in the set of balloons have been iterated through. and for each balloon:
iterate through the anchor points that are not already attached to a balloon by a leader, and for each such anchor point calculating a value of an angle formed by an intersection of a line extending between the balloon and the anchor point and the substantially straight line:
compare the calculated values for each such anchor point: and
attach the balloon to an anchor point using a leader based on the comparison of the calculated values:
wherein upon completion of one iteration through the balloons no two leaders intersect, and wherein:
instructions operable to calculate the value of an angle comprise instructions operable to calculate a reflex angle formed between a segment connecting the balloon to the anchor point and a ray that originates at the balloon and extends along the straight line in a direction away from a second outermost balloon situated on the substantially straight line;
instructions operable to compare the calculated values for each such anchor point comprise instructions operable to determine the largest reflex angle; and
instructions operable to attach the balloon to an anchor point based on the comparison of the calculated values comprise instructions operable to attach the balloon to an anchor point corresponding to the largest reflex angle.

10. A computer program product, tangibly stored on a computer-readable medium, for attaching balloons to anchor points, comprising:
instructions operable to cause a programmable processor to:
receive a set of balloons arranged along a substantially straight line;
receive a set of anchors points positioned on either or both sides of the substantially straight line;
iterate through the balloons in the set of balloons, selecting an outermost balloon for a first iteration and progressively selecting a next adjacent balloon for each successive iteration until all balloons in the set of balloons have been iterated through, and for each balloon:
iterate through the anchor points that are not already attached to a balloon by a leader, and for each such anchor point calculating a value of an angle formed by an intersection of a line extending between the balloon and the anchor point and the substantially straight line:
compare the calculated values for each such anchor point; and
attach the balloon to an anchor point using a leader based on the comparison of the calculated values;
wherein upon completion of one iteration through the balloons no two leaders intersect, and wherein:
instructions operable to calculate the value of an angle comprise instructions operable to calculate a non-reflex angle formed between a segment connecting the balloon to the anchor point and a ray that originates at the balloon and extends along the straight line in a direction toward a second outermost balloon situated on the substantially straight line;
instructions operable to compare the calculated values for each such anchor point comprise instructions operable to determine the largest non-reflex angle; and
instructions operable to attach the balloon to an anchor point based on the comparison of the calculated values comprise instructions operable to attach the balloon to an anchor point corresponding to the largest non-reflex angle.

11. A computer program product, tangibly stored on a computer-readable medium, for attaching balloons to anchor points, comprising:
instructions operable to cause a programmable processor to:
receive a set of balloons arranged along a substantially straight line;
receive a set of anchors points positioned on either or both sides of the substantially straight line;
iterate through the balloons in the set of balloons. selecting an outermost balloon for a first iteration and progressively selecting a next adjacent balloon for each successive iteration until all balloons in the set of balloons have been iterated through, and for each balloon:
iterate through the anchor points that are not already attached to a balloon by a leader, and for each such anchor point calculating a value of an angle formed by an intersection of a line extending between the balloon and the anchor point and the substantially straight line:
compare the calculated values for each such anchor point; and
attach the balloon to an anchor point using a leader based on the comparison of the calculated values;
wherein upon completion of one iteration through the balloons no two leaders intersect, and wherein:
instructions operable to calculate the value of an angle comprise instructions operable to calculate a reflex angle formed between a segment connecting the balloon to the anchor point and a ray that originates at the balloon and extends along the straight line in a direction toward a second outermost balloon situated on the substantially straight line;
instructions operable to compare the calculated values for each such anchor point comprise instructions operable to determine the smallest reflex angle; and
instructions operable to attach the balloon to an anchor point based on the comparison of the calculated values comprise instructions operable to attach the balloon to an anchor point corresponding to the smallest reflex angle.

12. The computer program product of claim 8, 9, 10, or 11, wherein the substantially straight line is a substantially horizontal line.

13. The computer program product of claim 8, 9, 10, or 11, wherein the substantially straight line is a substantially vertical line.

14. The computer program product of claim 8, 9, 10, or 11, wherein there are an equal number of balloons and anchor points and upon completion of one iteration each balloon in the set of balloons is attached to one anchor point in the set of anchor points by a leader.

* * * * *

UNITED STATES PATENT AND TRADEMARK OFFICE
CERTIFICATE OF CORRECTION

PATENT NO.         : 7,636,096 B2                                              Page 1 of 5
APPLICATION NO. : 10/877643
DATED              : December 22, 2009
INVENTOR(S)       : Martin Mikulecky It is certified that error appears in the above-identified patent and that said Letters Patent is hereby corrected as shown below:

On the Title Page, (75) Inventor, replace:
 "Martin Mikulecky, Desin (CZ)" with
 -- Martin Mikulecky, Decin (CZ) --

Column 18, Line 5, in Claim 1, replace:
 "points." with
 -- points, --

Column 18, Line 10, in Claim 1, replace:
 "line:" with
 -- line; --

Column 18, Line 11, in Claim 1, replace:
 "anchors" with
 -- anchor --

Column 18, Line 12, in Claim 1, replace:
 "line:" with
 -- line; --

Column 18, Line 17, in Claim 1, replace:
 "through." with
 -- through, --

Column 18, Line 22, in Claim 1, replace:
 "line:" with
 -- line; --

Column 18, Line 24, in Claim 1, replace:
 "point:" with
 -- point; --

Signed and Sealed this

Eighth Day of June, 2010

David J. Kappos
*Director of the United States Patent and Trademark Office*

Column 18, Line 25-26, in Claim 1, replace:
"values:" with
-- values; --

Column 18, Line 47, in Claim 2, replace:
"line:" with
-- line; --

Column 18, Line 48, in Claim 2, replace:
"anchors:" with
-- anchor --

Column 18, Line 49, in Claim 2, replace:
"line:" with
-- line; --

Column 18, Line 50, in Claim 2, replace:
"balloons:" with
-- balloons, --

Column 18, Line 54, in Claim 2, replace:
"through." with
-- through, --

Column 18, Line 59, in Claim 2, replace:
"line:" with
-- line; --

Column 18, Line 61, in Claim 2, replace:
"point:" with
-- point; --

Column 18, Line 62-63, in Claim 2, replace:
"values:" with
-- values; --

Column 19, Line 11, in Claim 3, replace:
"points." with
-- points, --

Column 19, Line 17, in Claim 3, replace:
"line:" with
-- line; --

Column 19, Line 18, in Claim 3, replace:
"anchors" with
-- anchor --

Column 19, Line 19, in Claim 3, replace:
"line:" with
-- line; --

Column 19, Line 20, in Claim 3, replace:
"balloons." with
-- balloons, --

Column 19, Line 24, in Claim 3, replace:
"through." with
-- through, --

Column 19, Line 29, in Claim 3, replace:
"line:" with
-- line; --

Column 19, Line 31, in Claim 3, replace:
"point:" with
-- point; --

Column 19, Line 32-33, in Claim 3, replace:
"values:" with
-- values; --

Column 19, Line 49, in Claim 4, insert before "method":
-- A --

Column 19, Line 49, in Claim 4, replace:
"points." with
-- points, --

Column 19, Line 54, in Claim 4, replace:
"line:" with
-- line; --

Column 19, Line 56, in Claim 4, replace:
"anchors" with
-- anchor --

Column 19, Line 57, in Claim 4, replace:
"line:" with
-- line; --

Column 19, Line 58, in Claim 4, replace:
"balloons." with
-- balloons, --

Column 19, Line 62, in Claim 4, replace:
"through." with
-- through, --

Column 19, Line 67, in Claim 4, replace:
"line:" with
-- line; --

Column 20, Line 28, in Claim 8, replace:
"product." with
-- product, --

Column 20, Line 30, in Claim 8, replace:
"points." with
-- points, --

Column 20, Line 35, in Claim 8, replace:
"anchors" with
-- anchor --

Column 20, Line 36, in Claim 8, replace:
"line:" with
-- line; --

Column 20, Line 37, in Claim 8, replace:
"balloons," with
-- balloons --

Column 20, Line 37, in Claim 8, replace:
"balloons." with
-- balloons, --

Column 21, Line 8, in Claim 9, replace:
"anchors" with
-- anchor --

Column 21, Line 10, in Claim 9, replace:
"balloons." with
-- balloons, --

Column 21, Line 14, in Claim 9, replace:
"through." with
-- through, --

Column 21, Line 19, in Claim 9, replace:
"line:" with
-- line; --

Column 21, Line 20, in Claim 9, replace:
"point:" with
-- point; --

Column 21, Line 23, in Claim 9, replace:
"values:" with
-- values; --

Column 21, Line 47, in Claim 10, replace:
"anchors" with
-- anchor --

Column 21, Line 58, in Claim 10, replace:
"line:" with
-- line; --

Column 22, Line 21, in Claim 11, replace:
"anchors" with
-- anchor --

Column 22, Line 23, in Claim 11, replace:
"balloons." with
-- balloons --

Column 22, Line 32, in Claim 11, replace:
"line:" with
-- line; --

UNITED STATES PATENT AND TRADEMARK OFFICE
CERTIFICATE OF CORRECTION

PATENT NO. : 7,636,096 B2  Page 1 of 1
APPLICATION NO. : 10/877643
DATED : December 22, 2009
INVENTOR(S) : Martin Mikulecky It is certified that error appears in the above-identified patent and that said Letters Patent is hereby corrected as shown below:

Title page (*) Notice

Delete "by 899 days" – and insert --by 1241 days--

Signed and Sealed this

Twenty-fourth Day of August, 2010

David J. Kappos
*Director of the United States Patent and Trademark Office*